United States Patent [19]
Saito et al.

[11] Patent Number: 5,691,556
[45] Date of Patent: Nov. 25, 1997

[54] STEP-UP SEMICONDUCTOR INTEGRATED CIRCUIT AND ELECTRONIC EQUIPMENT USING THE SEMICONDUCTOR INTEGRATED CIRCUIT

[75] Inventors: Yutaka Saito; Hiroshi Takahashi; Hiroshi Odagiri; Katsuhiro Horiguchi, all of Tokyo, Japan

[73] Assignee: Seiko Instruments Inc., Japan

[21] Appl. No.: 197,732

[22] Filed: Feb. 17, 1994

[30] Foreign Application Priority Data

| Feb. 17, 1993 | [JP] | Japan | 5-028265 |
| Feb. 22, 1993 | [JP] | Japan | 5-032309 |
| Mar. 16, 1993 | [JP] | Japan | 5-056206 |
| Mar. 22, 1993 | [JP] | Japan | 5-062256 |
| Dec. 28, 1993 | [JP] | Japan | 5-335424 |

[51] Int. Cl.$^6$ .............. H01L 27/01; H01L 29/00
[52] U.S. Cl. .............. 257/350; 257/351; 257/532
[58] Field of Search ............... 257/347, 352, 257/353, 354, 506, 507, 510, 524, 532, 533; 307/482, 578, 246, 270

[56] References Cited

U.S. PATENT DOCUMENTS

| 3,786,560 | 1/1974 | Cunningham | 257/524 |
| 3,967,309 | 6/1976 | Miyata | 257/524 |
| 4,419,812 | 12/1983 | Topich | 29/571 |
| 4,809,052 | 2/1989 | Nishioka et al. | 257/532 |
| 5,241,211 | 8/1993 | Tashiro | 257/347 |
| 5,349,494 | 9/1994 | Ando | 257/532 |
| 5,428,236 | 6/1995 | Uchida | 257/305 |
| 5,544,102 | 8/1996 | Tobita et al. | 365/189.09 |

FOREIGN PATENT DOCUMENTS

| 0308634 | 3/1989 | European Pat. Off. |
| 3837119 | 5/1990 | Germany |

OTHER PUBLICATIONS

Patent Abstract of Japan, vol. 12, No. 112 (P–687) 9 Apr. 1988.

Patent Abstract of Japan, vol. 16, No. 352 (E–1241) 29 Jul. 1992.

Patent Abstracts of Japan, vol. 9, No. 328 (E–369) 24 Dec. 1985.

Patent Abstracts of Japan, vol. 15, No. 66 (E–1034) 15 Feb. 1991.

Patent Abstract of Japan, vol. 15, No. 40 (E–1028) 30 Jan. 1991.

*Primary Examiner*—Wael Fahmy
*Attorney, Agent, or Firm*—Adams & Wilks

[57] ABSTRACT

To avoid the parasitic bipolar effect occurring in MOS type devices, a monolithic boosting integrated circuit is formed using dielectrically isolated charge boosting elements. Each boosting element is formed of a rectifying element and a charge storing element connected in series. A semiconductor on insulator substrate is formed with a supporting substrate, an insulating layer and a semiconductor layer. The charge boosting elements are formed in the semiconductor layer and are electrically isolated using a dielectric film deposited over the semiconductor layer. By isolating the devices from the substrate, the parasitic bipolar effect is avoided and downsizing is possible thus permitting the formation of complex circuitry in a monolithic integrated circuit package.

50 Claims, 36 Drawing Sheets

128 operation time

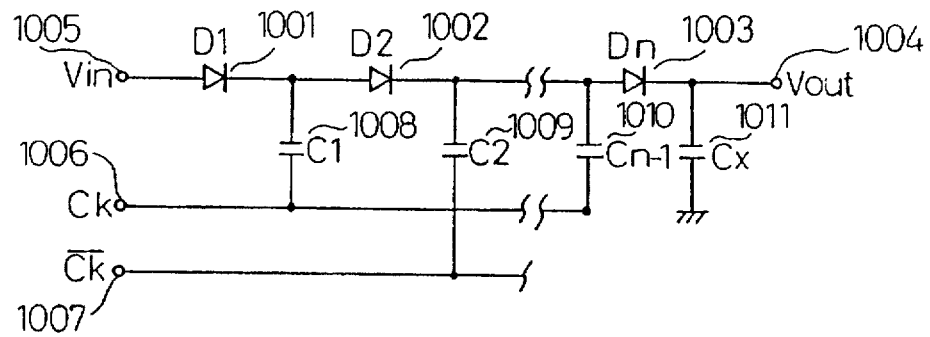
F I G. 2 0(a)
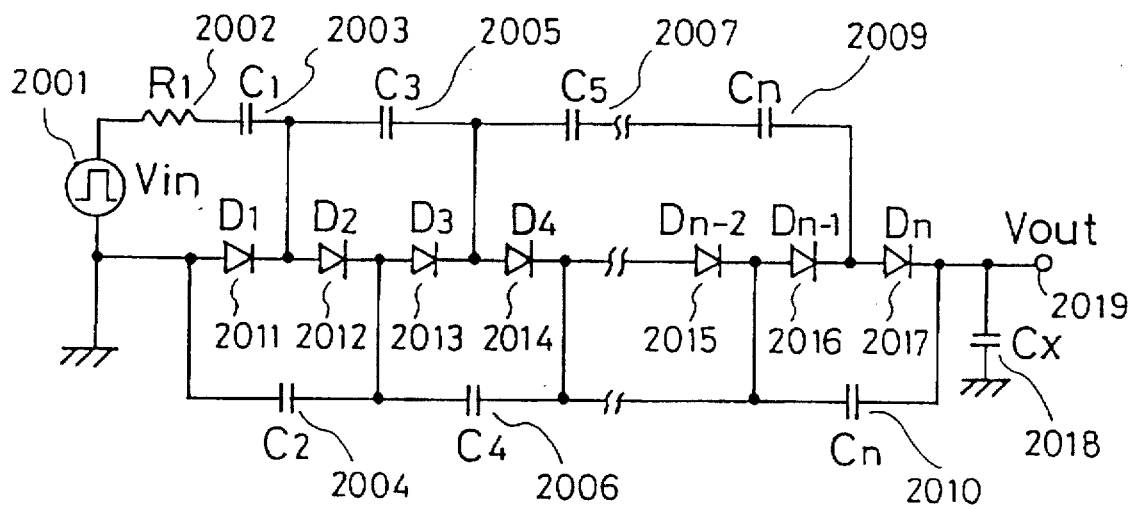
F I G. 2 0(b)

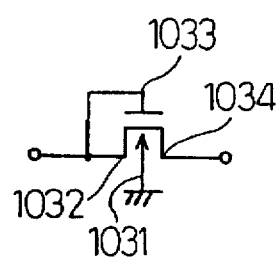
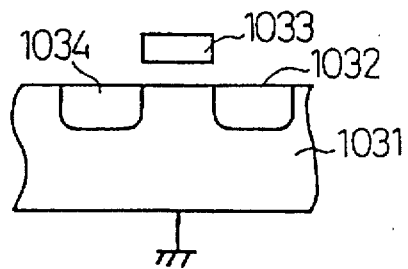
FIG. 23(a)
PRIOR ART
FIG. 23(b)
PRIOR ART
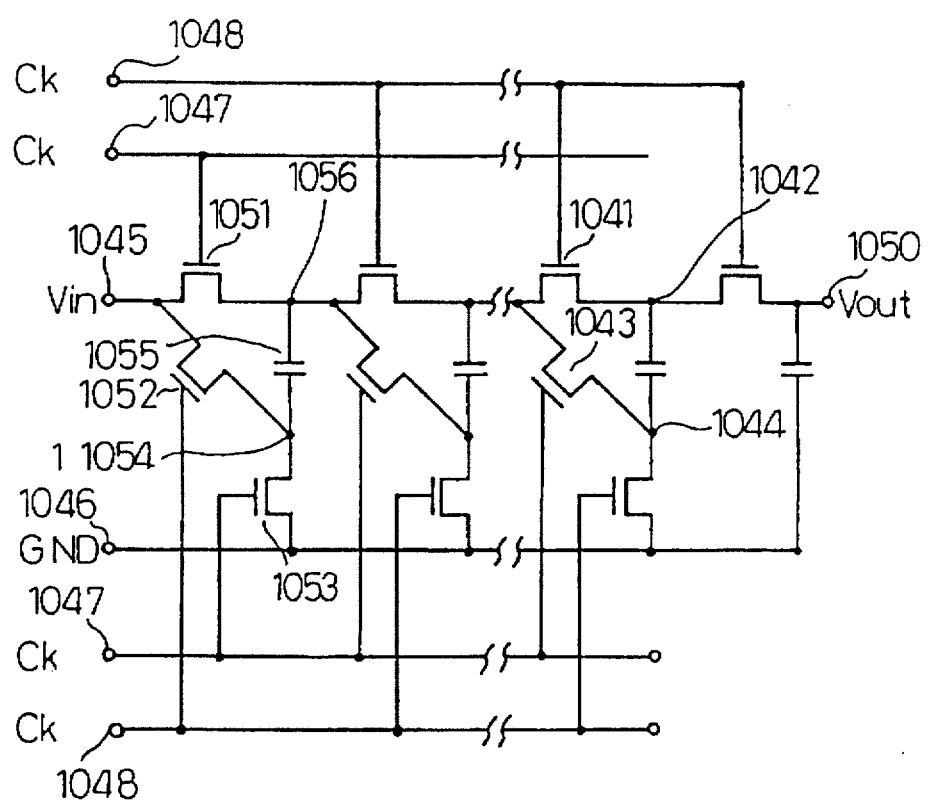
FIG. 24
PRIOR ART FIG. 32(a)
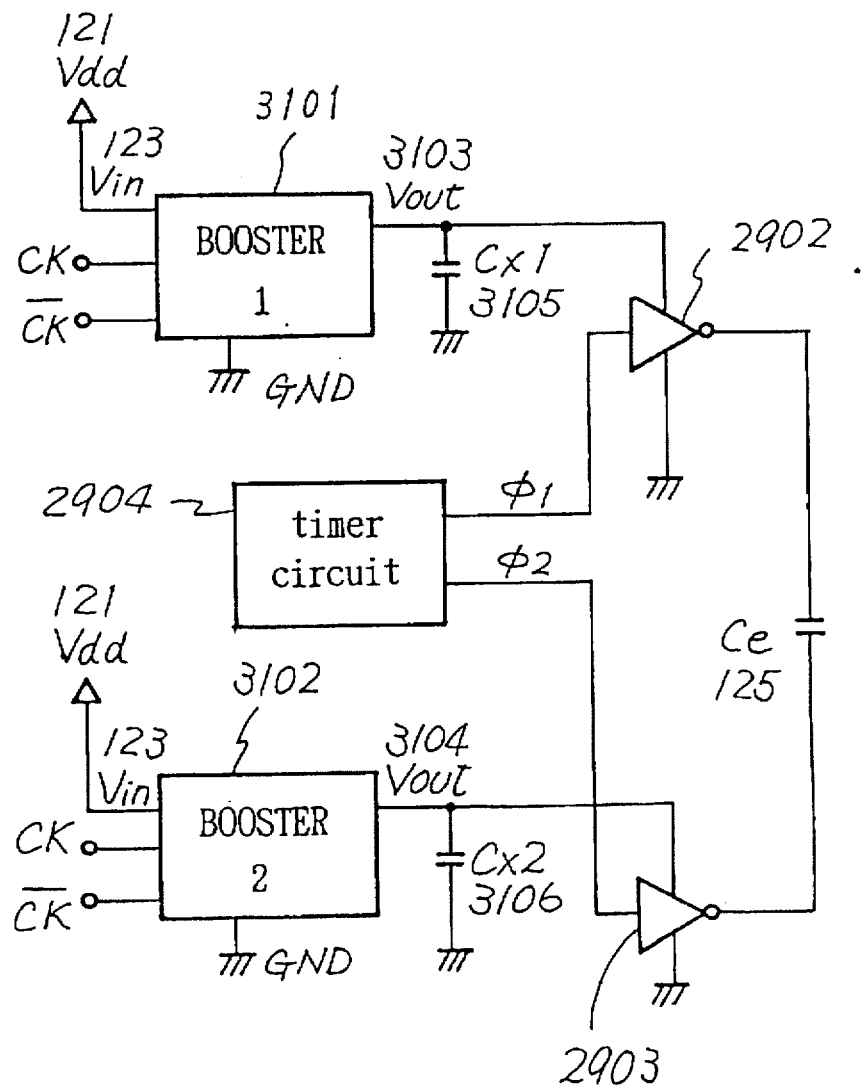
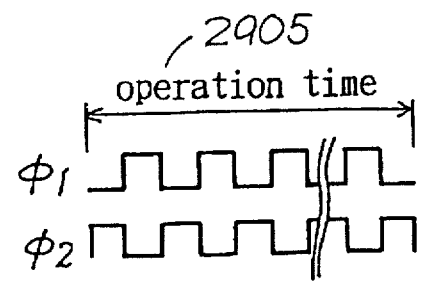
FIG. 32(b)

| total number of stages / number of stages in the booster circuit | N−1 | N−2 | N−3 | N−4 | N−5 | N−6 | N−7 | N−8 |
|---|---|---|---|---|---|---|---|---|
| 10 | 20·$V_{DD}$ | 27·$V_{DD}$ | 32·$V_{DD}$ | 35·$V_{DD}$ | 36·$V_{DD}$ | 35·$V_{DD}$ | 32·$V_{DD}$ | 18·$V_{DD}$ |
| 11 | 22·$V_{DD}$ | 30·$V_{DD}$ | 36·$V_{DD}$ | 38·$V_{DD}$ | 42·$V_{DD}$ | 42·$V_{DD}$ | 40·$V_{DD}$ | 36·$V_{DD}$ |
| 12 | 24·$V_{DD}$ | 33·$V_{DD}$ | 40·$V_{DD}$ | 45·$V_{DD}$ | 48·$V_{DD}$ | 49·$V_{DD}$ | 48·$V_{DD}$ | 45·$V_{DD}$ |

FIG. 36

STEP-UP SEMICONDUCTOR INTEGRATED CIRCUIT AND ELECTRONIC EQUIPMENT USING THE SEMICONDUCTOR INTEGRATED CIRCUIT

BACKGROUND OF THE INVENTION

1. Field of the Invention

The present invention relates to a semiconductor integrated circuit device having a voltage conversion function, and in particular to structural elements of the device and a method of manufacturing the same. Further, the present invention relates to a method of using the device in an electronic circuit and to electronic equipment into which the device is incorporated.

2. Background Discussion

A voltage conversion function (hereinafter referred to as a "converter") can roughly be classified into two sorts, that is, a voltage drop function and a voltage rise function. Conventionally, there have been various kinds of semiconductor integrated circuit devices having the voltage drop function, and such devices are widely used in the industrial field. However, in a conventional EL (electroluminescence) element drive circuit as shown in FIG. 25, it is a general principle that voltage conversion is performed by use of a transformer for achieving a step-up in voltage. Because of the use of a transformer, the voltage conversion of an alternating current into an alternating current (hereinafter referred to as an "AC-AC") is made easy and natural. However, during the voltage conversion of a direct current into a direct current (hereinafter referred to as a "DC-DC"), the direct current is first converted into a current of an alternating current component, step-up is conducted through a transformer, and the transformer output is thereafter rectified into a voltage of a direct current.

Further, in certain semiconductor integrated circuit devices such as nonvolatile memory devices and the like, in order to obtain a high voltage (high voltage of 10 to 20 V with respect to Vdd of 3 to 5 V) for the purpose of writing and erasing in the memory, a booster circuit using a MOS is generally formed in the semiconductor integrated circuit device in a monolithic manner.

FIG. 20 shows a circuit using a charge transfer device which is a booster circuit that functions without the use of a transformer (hereinafter referred to as a "charge pump"), and which comprises diodes (D1 1001 to Dn 1003). As shown in FIG. 21, by inputting a signal (hereinafter referred to as a "clock bar" or "$\overline{CK}$") whose phase is just opposite to that of a clock signal which is produced by an oscillation circuit (hereinafter referred to as a "clock" or "CK"), an output voltage Vout 1004 is given by the following expression (1):

$$Vout = Vin + nVin - (n+1) Vf \quad (1)$$

where n is the number of paired diodes and capacitors (C1 1008 to Cn-1 1010), and Vf is the quantity of a voltage drop across a single diode in the forward direction.

An example in which a conventional p-n junction is arranged in series on a single substrate will be described. FIG. 26 shows a schematic sectional view of the conventional semiconductor integrated circuit device. This circuit has the equivalent circuit shown in FIG. 27. FIG. 22 shows a charge pump circuit which is formed of MOS transistors. FIG. 23(a) is a schematic view showing electrodes of each of the MOS transistors shown in FIG. 22, and an output of the MOS transistor has a sectional structure shown in FIG. 23(b). In other words, a source 1034 and a drain 1032 are formed on the surface of a thick silicon substrate 1031. In this case, Vf in the expression (1) is replaced by a threshold voltage Vth of the transistor. As a monolithic booster circuit, there has been further known a Fibonacci type switch capacitor booster circuit as shown in FIG. 24. In such a way, a variety of booster circuits formed of MOS transistors have been used.

The conventional booster circuit and the step-up monolithic semiconductor integrated circuit device with the above-mentioned construction have such problems to be solved as described below.

As a first problem, the size of a device used for converting with the use of a transformer is far too large. As is well known, the size of the transformer is determined by a leakage flux and a frequency of an output a.c. component although it also depends upon an output electric power. As the frequency is increased, the transformer can be downsized. In the present technique, it cannot be made sufficiently small, and the dimension of several mm is required even in the thickness, which is about ten times as large as the typical monolithic semiconductor integrated circuit device. In such a size, when using it in portable equipment and the like, it cannot be made smaller than a certain degree, thereby not enabling an overall size improvement of a product. Moreover, in the DC-DC conversion, because the voltage of the direct current has been converted into an AC, there has been a problem as to an efficiency that such a conversion causes a loss. Further, in such a conversion (it is said a DC-DC converter of a switching type), it is generally said that if the frequency is made high, it can be subjected to downsize and high efficiency. However, it is the present condition that capabilities of a semiconductor integrated circuit device or the like which constitutes a peripheral electronic circuit are not yet sufficient. Further, in the switching type, since a current is converted into a magnetic flux once, some electromagnetic waves are always leaked. Recently, the leakage of the electromagnetic wave starts to come into question while making the handled frequency higher, and the trend of law regulation in view of the environment aspect is being taken about as the high frequency regulation.

As a second problem, as described above, there has been partially the monolithic semiconductor integrated circuit device; however, as shown in FIG. 22, such a device has a structure using the MOS transistors. This is because the diodes shown in FIG. 20 cannot be used to constitute the device. As shown in FIG. 26 a plurality of p-n junctions formed on the identical semiconductor substrate, that is, the diodes cannot be completely separated from one another independently as shown in FIG. 27. Each of the rectifying element diodes constitutes pn diodes 341 to 343 by a p-type substrate 330 being a cathode (n-type layer 331) and an anode, thereby constituting an anode p-type substrate common 344. Thus, when considering in a discrete connection manner, if the pn diode 343 at the final stage has the reverse direction withstand voltage for withstanding the boosted voltage at that time, such a booster circuit may be apparently realizable. However, these circuit elements are of a semiconductor, and in fact, these two kinds of p-n junctions constitute a pnp transistor as shown in FIG. 28, and has a circuit arrangement as shown. For example, when the CK 360 becomes a low level, Tr 352 allows a base current i to flow. At this time, since the CK 359 is at a high level, a charge whose voltage has been boosted at a first stage is stored in a node 357. However, at this time, the pnp transistor Tr 354 is rendered conductive in such a manner that the current 354 of the amount equal to the base current i×hfe is caused to flow toward the GND, as a result of which, in fact, the voltage cannot be boosted. This is the reason why it is impossible that the p-n junction is arranged on a single substrate, as repeatedly mentioned above. It is sure that if the individual parts (discrete) are joined together, such a structure can be made. However, this results in the same problem as that as to the size of the transformer as described above, and therefore there is no meaning for making a monolithic device. When arranging the MOS transistors, as shown in FIGS. 23(a) and 23(b), the respective MOS transistors use the substrate (Sub) 1031 commonly, and for example, when the substrate 1031 is now being grounded (GND), although a transistor in a first stage has no problems, a transistor at a second stage makes a step-up potential difference to be developed between its source and the substrate 1031. In such a case, Vth is elevated and represented by the following expression.

$$Vth = Vth(\text{initial}) + K \{(VB+2\phi)^{1/2} - (2\phi)^{1/2}\}$$

where VB is a substrate voltage with a reference of a source, Vth(initial) is Vth of the transistor when the substrate voltage is 0, K is a substrate bias constant, and $\phi$ is the Fermi level.

That is, as the number of stages is increased, Vth is elevated in such a manner that the transistor cannot gradually perform the ON operation and a step-up voltage comes to saturation. Experimentally, an actual limit is that a voltage rises to 10 several V with an input of 3 V. Further, an output current I is given by the following expression.

$$I \propto f \cdot C/n$$

where f is a frequency of CK, and C is a capacitance of a unit capacitor. Therefore, in order to increase the output current I, it is sufficient to make the capacitance C large. However, this causes its area to be rapidly increased, and therefore there is disadvantageous in an economical effect. When it is intended that the step-up voltage is increased, a withstand voltage in correspondence with the final output voltage is ensured in the capacitor, and therefore the film thickness of an insulation film of the capacitor is increased. In this case, the capacitance of the capacitor is reduced. Thus, in this type, the output voltage and the step-up voltage have the factor contrary to each other, respectively.

SUMMARY OF THE INVENTION

The present invention has been achieved in view of the above-mentioned problems accompanying the conventional device, and therefore an object of the present invention is to provide a booster circuit including means for realizing an excellent monolithic step-up semiconductor integrated circuit device and an electronic circuit in an electronic device into which the inventive boosting means is incorporated.

In a first embodiment, a method of constructing an improved monolithic step-up semiconductor integrated circuit device will be described. As described above, as a typical example of the monolithic step-up semiconductor integrated circuit device, there is the charge pump type circuit device, which comprises as fundamental elements a plurality of pairs consisting of a MOS transistor (or diodes) and a capacitor. Hereinafter, the MOS transistor is operated as a rectifier, and the capacitor functions as an electric charge storage and transfer device.

As a first feature of a first means, the transistors or diodes which function as a rectifier are formed on an SOI substrate in such a manner that they are electrically isolated from each other. Capacitances are also formed on the SOI substrate. Here, the term "SOI" is the abbreviation of "Silicon On Insulator" and SOI means a semiconductor substrate in which an insulation layer is formed on the semiconductor substrate and a thin-film semiconductor substrate is formed on the insulation layer. As the thickness of the thin-film semiconductor substrate, recently, thicknesses from 10 Å to several hundred microns have been realized. Also, as a method of manufacturing the semiconductor substrate, various sorts such as the SIMOX method, the ZMR method, the sticking method, and the like have been proposed and embodied.

As a second feature of the first means, the above-mentioned diode of the first embodiment is formed using a MOS transistor. As its third feature, the diode is formed of a polysilicon transistor (this means a MOS transistor formed on a multi-crystal silicon film, that is, a polysilicon film; hereinafter referred to as a "PTF"). As its fourth feature, the above-mentioned diode of the first feature is constituted by a diode which is produced by forming a p-n junction on a polysilicon film whose single crystal performance has been improved by the excimer laser (hereinafter referred to as a "poly recrystallization diode"). As its fifth to eighth features, the capacitor of the first to fourth features is constituted by 2-layer polysilicon film. As its ninth to twelfth features, the capacitor of the first to fourth features is constituted not by the SOI but by an insulation film formed on the general semiconductor substrate.

As a second means, the rectifying function and the capacitor as mentioned in the first feature are constructed in a longitudinal direction so as to have a stacked structure. By combining the first to twelfth features of the first means with the above feature of the second means, the first to twelfth features of the second means are obtained.

As a third means, the p-n junction is separately arranged on the SOI substrate, and generates an electric output upon receipt of a light or a radial ray. Further, as described above, it is constituted by a booster circuit which consists of a rectifying element and a capacitor.

As the first feature of a fourth means, an insulation film of the capacitor, that is, a dielectric film is constituted in the form of a three-layer structure which consists of a silicon oxide film—a silicon nitride film—a silicon oxide film. As its second feature, the dielectric film of the capacitor is constituted by a silicon oxide film—a tantalum oxide film ($Ta_2O_5$). As its third feature, the dielectric film of the capacitor is constituted by a strontium barium titanate $\{(Ba_x, Sr_{1-x}) TiO_3$ (hereinafter referred to as a "BST base film")$\}$. As its fourth feature, the dielectric film of the capacitor is constituted by a titanate zirconate $\{Pb (Zr, Ti)O_3$, (hereinafter referred to as a "PZT origin film")$\}$.

As its fifth feature, a portion of the insulation film on the rectifying element, which is crossed by a wiring electrically connecting the rectifying element and the capacitor, is made thicker than an insulation film used for the capacitor element. As its sixth feature, the dielectric films of the capacitor elements are different in their thickness from one another. As its seventh feature, the rectifying elements are separated from one another by Si etching and locos oxidation. As its eighth feature, the surface of a polysilicon of the PTF is made flat by grinding. As its ninth feature, the source and drain of a transistor for a rectifying element are formed by the MLD. Here the term "MLD" is the abbreviation of "Molecular layer doping" method with which is made a shallow doping region. As a tenth feature, the source of a rectifying transistor is formed by an LDD structure. As its eleventh feature, the rectifying element is formed by the recrystallization of the polysilicon due to the excimer laser. As its twelfth feature, the impurity region of the opposite conductive type is formed by diffusion of the polysilicon.

As the first feature of a fifth means, EL (electroluminescence, electronic excitation luminescence) elements are connected to each other in such a manner that abooster circuit of an EL element control circuit for luminescence is constituted in the form of the charge pump.

As its second feature, the booster circuit of the EL element control circuit for luminescence of the EL element is constituted by a switched capacitor type. As its third feature, an electric power is generated upon receipt of the voltage step-up for driving the EL element and a light, and charging for a battery is switched according to an exterior signal. As its fourth feature, there is a built-in oscillation signal generating circuit. As its fifth feature, there means including an oscillation signal generating circuit and providing a signal generated by the oscillation signal generating circuit with positive and negative (plus and minus) voltage of a power source with respect to the ground (GND) by a so-called voltage doubler or doubler. As its sixth feature, in the circuit of the switched capacitor type, the grounded side (common) of a oscillation signal system and the grounding (GND) of a step-up voltage side are separated by a rectifying element. As its seventh feature, a voltage or current of the step-up voltage is adjusted by changing the ratio of the period of time between positive and negative signals generated by the oscillation signal generating circuit. As its eighth feature, the voltage or current of a step-up voltage is adjusted by changing a frequency of the signal generated by the oscillation signal generating circuit. As its ninth feature, a capacitor is provided at an end of a step-up output in such a manner that the step-up output is periodically generated during a period when the EL is not driven and the capacitor is preliminarily charged.

As a tenth feature, a capacitor and an invertor are disposed at an end of a step-up output in such a manner that the capacitor is preliminarily charged during a period when the EL is not driven (a period when an EL terminal is in a grounded state). Further, there is provided a built-in timer circuit for driving the invertor so that an output which has been raised by setting the timer circuit can be applied at an arbitrary time duration. As its eleventh feature, two booster circuits are provided for driving the EL element, and the step-up output is alternately applied to both sides of the EL element.

As a sixth means, a high-voltage breakdown diode is disposed between an input terminal, a CK terminal and a $\overline{CK}$ terminal of the booster circuit and between an output terminal, a CK terminal and a $\overline{CK}$ terminal of the booster circuit, respectively, for protection against an electrostatic breakdown.

As the first feature of a seventh means, there are provided a first boosting means for boosting a voltage of a power source which consists of a primary battery or a secondary battery, a step-up clock pulse generating means for generating a step-up voltage which allows a pulse having a step-up output voltage level of the first boosting means to be generated, and a second boosting means for boosting a step-up voltage generated by the first boosting means in accordance with the clock pulse generated by the step-up clock pulse generating means. Further, as its second feature, a basic unit constituting a step-up semiconductor integrated circuit is formed by a pair of a MOS transistor or diode and a capacitor where n is a positive integer of 1 or more, the basic unit constituting the step-up semiconductor integrated circuit is structured by n-stages, and the number of stages of the first boosting circuit is constituted by n/2 stages.

In a eighth means, as its first feature, there is provided an output adjusting circuit which changes a step-up output voltage boosted by a booster circuit by changing a frequency or duty ratio of a drive clock signal of the output adjusting circuit. As its second feature, the boosted output voltage is changeable by changing the number of the step-up stages in the booster circuit.

The following operation can be obtained with the above-described means.

The first means operates as follows. That is, in the booster circuit of the charge pump type or the switched capacitor type, since the paired rectifier and capacitor are completely separated from each other, the step-up semiconductor integrated circuit device of the present invention is capable of performing a high magnification which ranges from several V to several 100 V which could not have been achieved by the conventional monolithic device.

The second means operates as follows. That is, the area (chip size) of such a semiconductor integrated circuit device can be reduced with a large amount of economical effect.

The third means operates as follows. That is, the semiconductor integrated circuit device with the above-described step-up function operates so as to output an electric signal upon receiving a light. By switching operation, it can be changed to a charging type semiconductor integrated circuit device.

The fourth means operates as follows. That is, the above-described semiconductor integrated circuit can be obtained with a higher performance at a lower cost.

The fifth means operates as follows. That is, the semiconductor integrated circuit device of the present invention is capable of realizing a thin-type EL light emitting element built-in electronic equipment which could not have been performed conventionally. Moreover, electronic equipment can be realized which provides a charging function, a function which indicates a variety of messages and alarms by means of varying the manner (tint or luminance) of emitting a light from the EL.

The sixth means operates as follows. That is, in the semiconductor integrated circuit to which such a high electric field is applied, the respective elements are prevented from breakdown by a noise or unnecessary static electricity without provision of an additional external protecting unit.

The seventh means operated as follows. That is, after a power voltage has been boosted by the first boosting means, a clock pulse with its step-up voltage level is generated by the step-up clock pulse generating means and the second boosting means is driven by the pulse. As a result, a high step-up voltage can be obtained even if the number of stages for charge pumps which constitute a booster circuit is reduced, and therefore the size of a chip can be reduced and the electronic equipment employing this device can also be downsized.

The eighth means operates as follows. That is, the output adjusting circuit is disposed in the booster circuit in such a manner that the number of boosting stages of the booster circuit can be changed so that the output voltage boosted by the boosting circuit can be changed to an arbitrary output voltage. As a result, the output characteristics and output state of the output element can be changed arbitrarily.

BRIEF DESCRIPTION OF THE DRAWINGS

Other objects, advantages and features of the invention will be apparent when carefully reading the following detailed description in connection with the accompanying drawings, in which:

FIG. 20 is a schematic circuit diagram showing a booster circuit of the charge pump type which does not use a conventional transformer;

FIG. 23 is a schematic diagram showing a conventional MOS transistors;

FIG. 24 is a circuit diagram showing a schematic principle structure of a conventional Fibonacci type switched capacitor booster circuit;

FIG. 32 is a schematic block diagram showing an EL light emitting element drive circuit according to a thirteenth embodiment of the present invention;

FIG. 36 is an explanatory diagram of numerical values representative of the change of a step-up output when making the number N of stages in a charge pump constant in the fifteenth embodiment of the present invention;

DETAILED DESCRIPTION OF THE PREFERRED EMBODIMENTS

Now, preferred embodiments of the present invention will be described with reference to the accompanying drawings.

Figure 1:
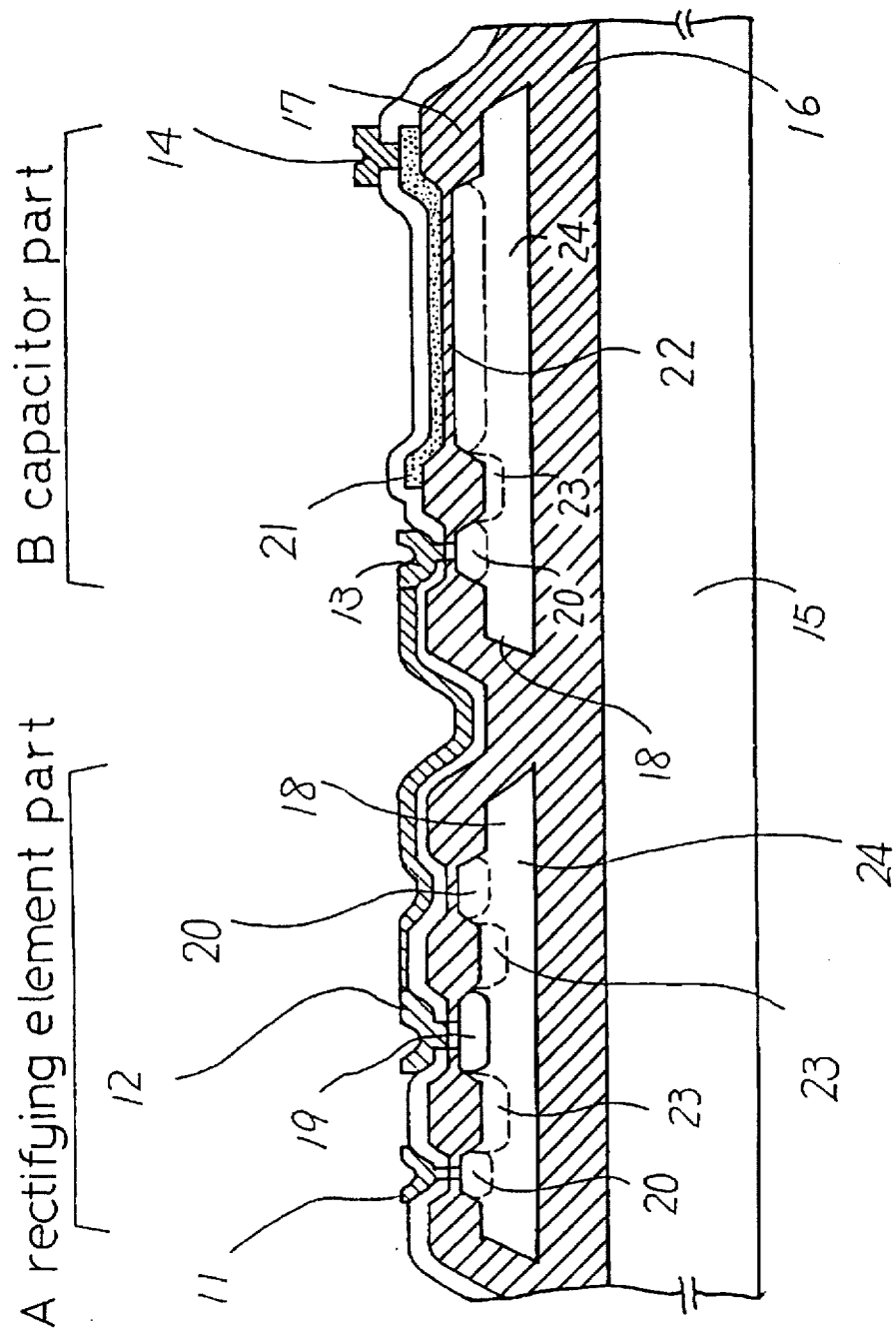
FIG. 1 is a schematic sectional view showing a pair of a rectifier and a capacitor in a semiconductor integrated circuit device according to a first embodiment of the present invention.
Figure 2:
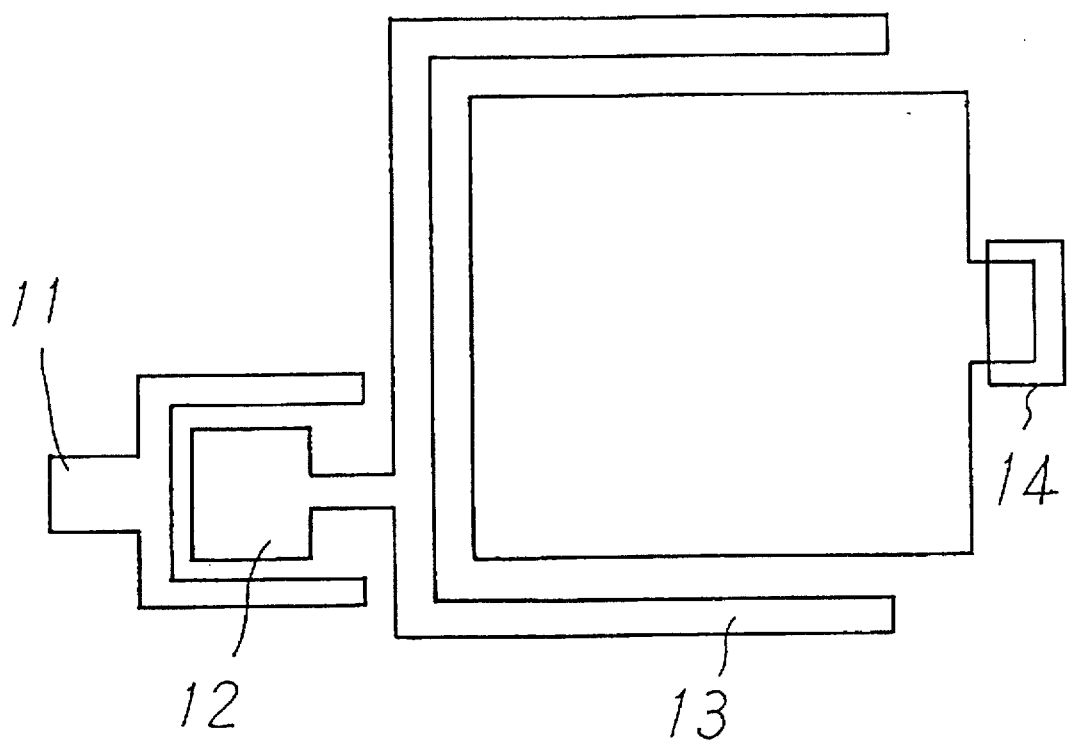
FIG. 2 is a schematic plan view showing an electrode in the semiconductor integrated circuit device according to the first embodiment.
Figure 3:
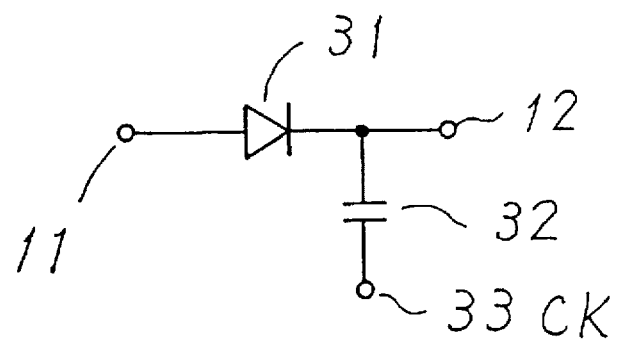
FIG. 3 is schematic circuit diagram showing a rectifier and a capacitor in a pair (hereinafter sometimes referred to as a "pair") in a booster circuit of the charge pump type in the semiconductor integrated circuit device according to the first embodiment.

FIG. 1 shows a schematic sectional view of a rectifier and a capacitor in a pair which constitutes a semiconductor integrated circuit device according to a first embodiment of the invention. In the figure, an Si layer 18 is a p-type semiconductor substrate and constitutes a p-type layer 24. The Si layer 18 has an n+ type layer 19 and constitutes a rectifying element part A which is formed by a p-n junction and provides a rectifying function. The rectifying element part A is formed by completely separating an Si substrate 15 which is a support substrate and other elements adjacent to the substrate 15 by an $SiO_2$ 16 and locos oxide film 17. A capacitor insulation film 22 is formed on the Si layer 18, and a capacitor electrode 21 is also formed on the capacitor insulation film 22 so that a capacitor part B is formed isolated from other elements. FIG. 2 shows a schematic plan view of electrodes including an anode electrode 11, a cathode electrode 12, metalization line 13 and clock electrode CK 14 representative of the semiconductor integrated circuit device according to the first embodiment. FIG. 3 is a schematic diagram of a rectifier 31 and a capacitor 32 in one pair (hereinafter sometimes referred to as "the pair") in a booster circuit of the charge pump type in the semiconductor integrated circuit device of the first embodiment. The structure shown in FIG. 1 is connected to each other by means of a wiring line 13 as shown in FIG. 2, thereby to form a circuit shown in FIG. 3. This pair is connected to a large number of similar pairs as shown in FIG. 20(a), so that a monolithic step-up semiconductor integrated circuit device is realized.

In the semiconductor integrated circuit of the present invention, an insulation film of the capacitor, that is, a dielectric film is provided in the form of a three-layer structure consisting of a silicon oxide film—a silicon nitrogen film, thereby to obtain a capacitor of a large capacitance with a small area. Moreover, a dielectric film of the capacitor is structured by a ferroelectric film of a silicon oxide film—a tantalum oxide film $(Ta_2O_5)$, a barium strontium titanate $\{(Bax, Sr1-x)TiO_3\}$, (hereinafter referred to as "BST origin film"), and a titanate zirconate $(Pb(Zr,Ti)O_3)$, (hereinafter referred to as a "PZT" origin film"), thereby enabling formation of a capacitor having a reduced area without a decrease in capacitance. Furthermore, a portion of the insulation film formed on the rectifying element, which is crossed by a wiring electrically connecting the rectifying element and the capacitor, is made thicker than the insulation film used for the capacitor element, a result of which being that the effect of a parasitic capacitance can be reduced. Each of the dielectric films of the capacitor elements has a different thickness, respectively, whereby the area of the capacitor can be reduced (a lower voltage portion has a thin insulation film whereas a higher voltage portion has a thick insulation film).

For example, to obtain a 100 V output from a 3 V input, it is necessary to have 42 capacitor elements (40 is used to make the following calculations simple). Final capacitor and those close to final are applied approximately 100 volts. Therefore, it is necessary to have at least 3000 Å dielectric film thickness ($SiO_2$ as a dielectric film, as a capacitor situation) to keep electric field below 3 MV/cm, in terms of the sufficient (10 years operation) TDDB (Time Dependence Dielectric Breakdown) reliability. The other side, meaning the capacitors close to the input, for example the tenth stage from the input, has applied thereto approximately 24 volts, and approximately 800 Å thickness is enough. A smaller film thickness means smaller area and size and of the capacitor, in terms of the same capacitance value. For instance, 4 different film thicknesses may be enough for all capacitors, i.e., the 1st to 10th stages from the input side are applied 24 V maximum, and thus a film thickness of 800 Å is enough; similarly, for the 11th to 20th stages, 48 V is applied, and 1500 Å is adequate, in the 21st to 30th stages, 70 V is applied, and 2100 Å is adequate, and in the 31st to 40th stages, 100 V is applied, requiring a film thickness of 3000 Å, for a total of 37.5% size reduction when compared to the total size when a uniform 3000 Å film thickness is used for all elements. In terms of above disclosure, the total size of all capacitors is given as follows:

$$S = \frac{n}{m} S_0 \sum_{k=0}^{m-1} \frac{m-k}{m}$$

where the term S is the total area of the capacitor elements, n is the number of the total capacitor elements, $S_0$ is the area of the final capacitor element, m is the number of the set variation of dielectric film thickness. Increase the number of m to decrease the area size means increasing the process steps. In this invention, 2 to 4 as m is expected in terms of the break even point between decreasing the area size and increasing the process steps.

Figure 4:
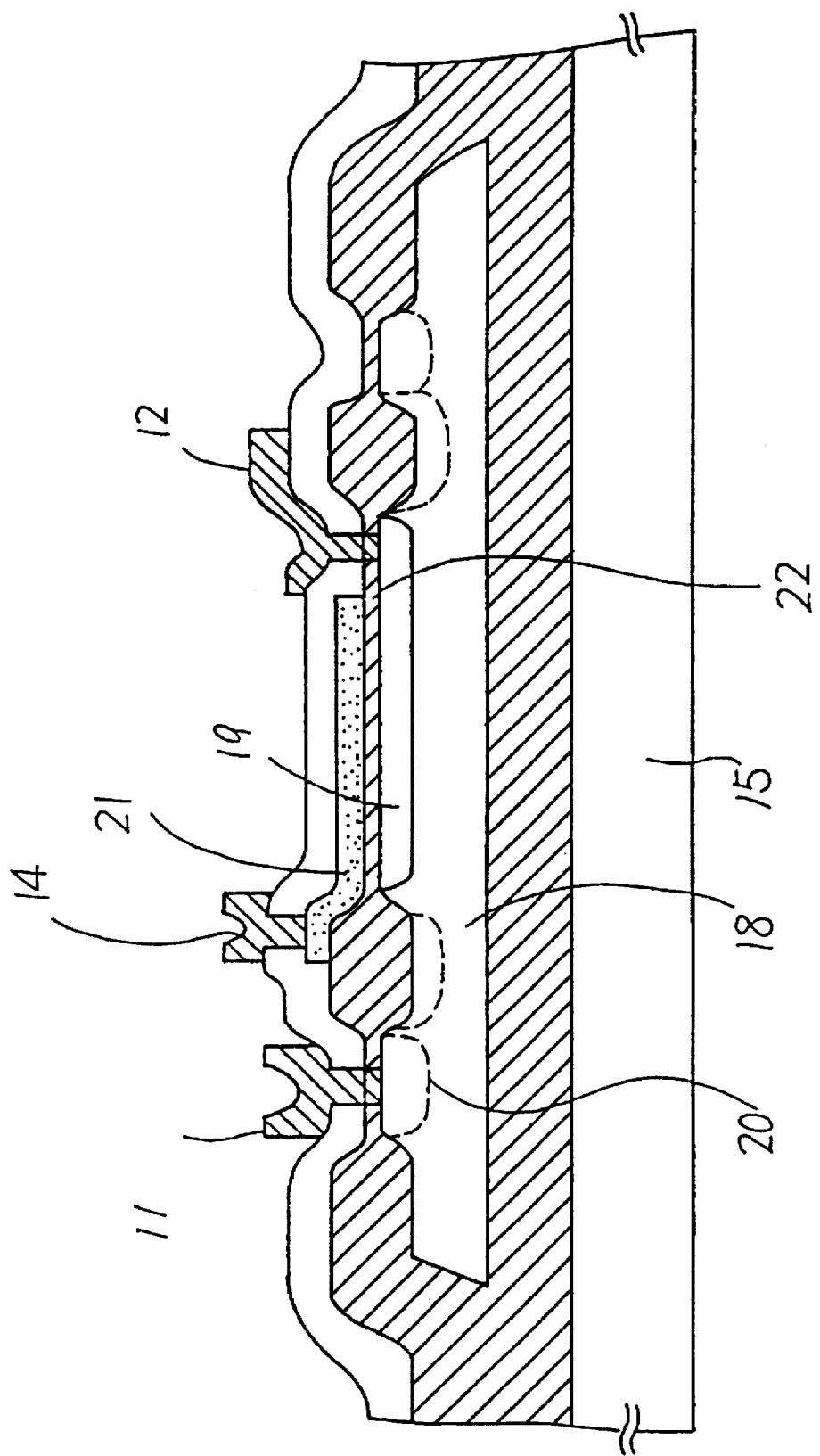
FIG. 4 is a schematic sectional view showing a rectifier and a capacitor in a pair in a semiconductor integrated circuit device according to a second embodiment of the present invention.

FIG. 4 shows a schematic sectional view of a rectifier and a capacitor in a pair, which constitutes a semiconductor integrated circuit device according to a second embodiment of the present invention. An Si layer 18 is formed by a p-type semiconductor substrate in the embodiment, and a capacitor, which performs a rectifying function by means of the p-n junction with an $n^+$-type layer 19, is formed in such a manner that a capacitor insulation film 22 is disposed on the $n^+$-type layer 19 and a capacitor electrode 21 is formed on the film 22.

Figure 5:
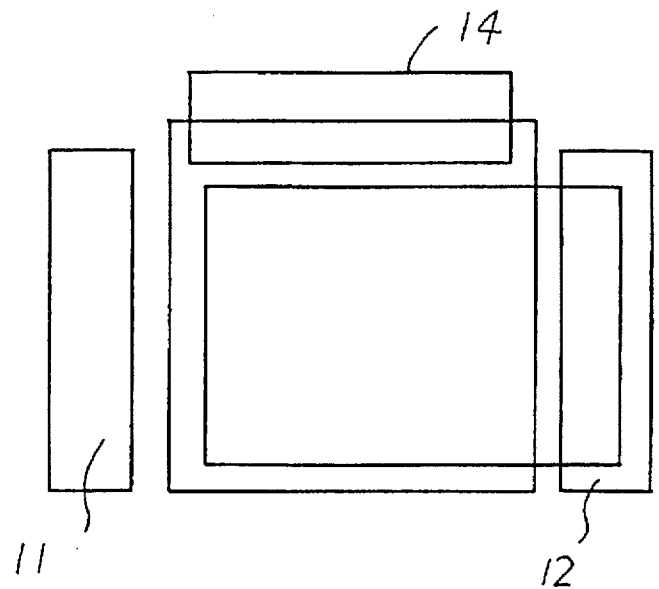
FIG. 5 is a schematic plan view showing an electrode in the semiconductor integrated circuit device according to the second embodiment.

FIG. 5 shows a schematic plan view of electrodes in a semiconductor integrated circuit device according to this embodiment. With such a construction, the pair as described in the first embodiment is capable of being formed on the identical plane, and its area can be remarkably reduced.

Figure 6:
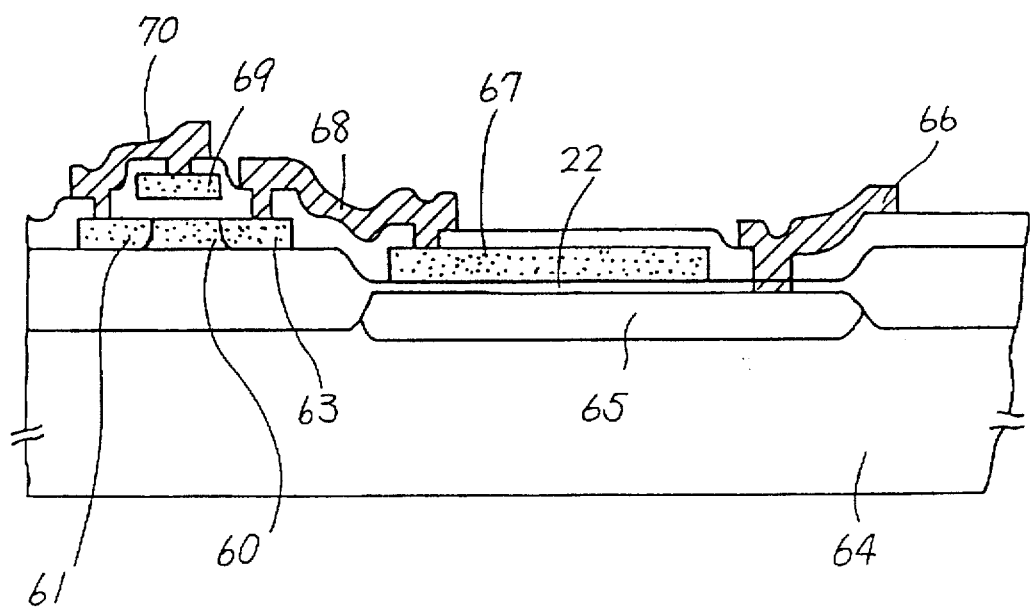
FIG. 6 is a schematic sectional view showing a rectifier and a capacitor in a pair in a semiconductor integrated circuit according to a third embodiment of the present invention.
Figure 8:
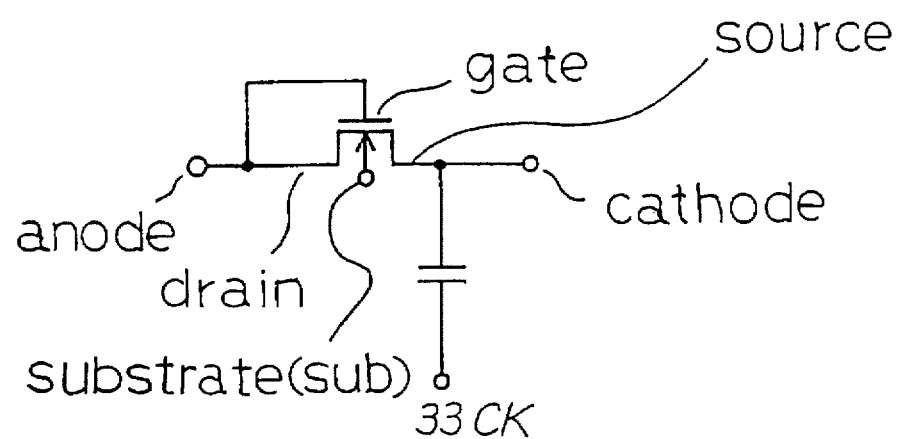
FIG. 8 is a schematic circuit diagram showing a transistor and a capacitor in a pair according to the third embodiment.

FIG. 6 shows a schematic sectional view of a rectifier and a capacitor in a pair, which constitutes a semiconductor integrated circuit device according to a third embodiment of the invention. In the figure, a capacitor consisting of a capacitor insulation film 22, impurity region 65 and a capacitor electrode 67, which are formed on a usual semiconductor substrate 64 that is not an SOI, is connected to a polysilicon MOS transistor, that is, a PTF, which consists of a drain region 61, a source region 63 and source electrode 68 and a gate electrode 69 and metallization 70 in a polysilicon substrate 60 which is formed on the identical semiconductor substrate, thereby to form a transistor and capacitor in a pair, as shown in FIG. 8.

Figure 7:
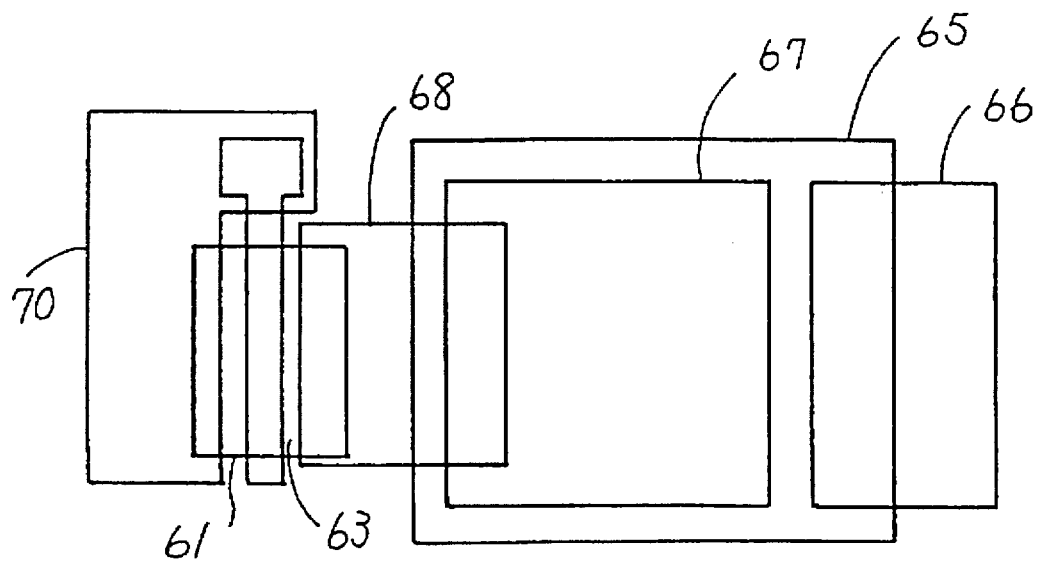
FIG. 7 is a schematic plan view showing an electrode in the semiconductor integrated circuit according to the third embodiment.
Figure 22:
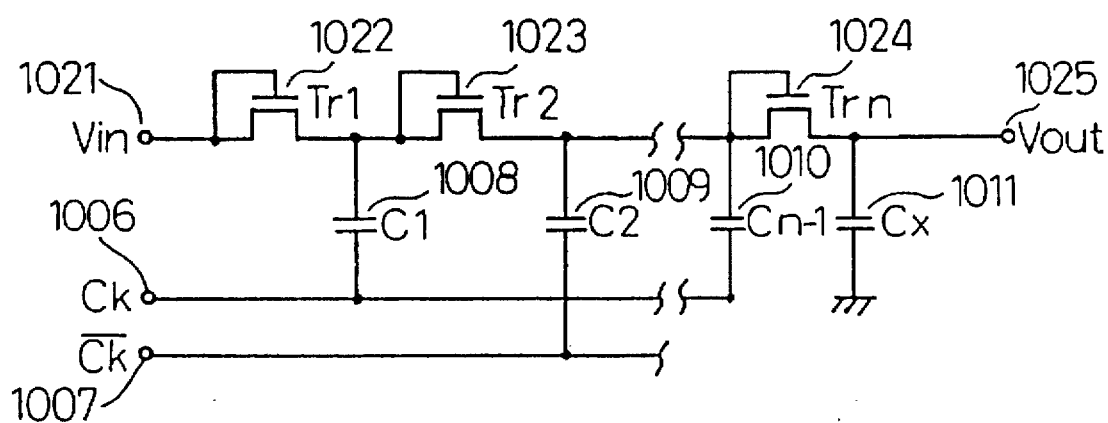
FIG. 22 is a schematic circuit diagram showing a conventional charge pump circuit which has been constituted MOS transistor.

FIG. 7 shows a schematic plan view of electrodes which constitute a semiconductor integrated circuit device according to this embodiment. These pairs are connected to one another a large number in such a manner that a charge pump booster circuit is formed as shown in FIG. 22. According to this embodiment, a booster circuit can be realized with a high quality at a low cost without use of SOI substrate and also without rising of Vth of a MOS transistor due to the substrate effect.

Figure 9:
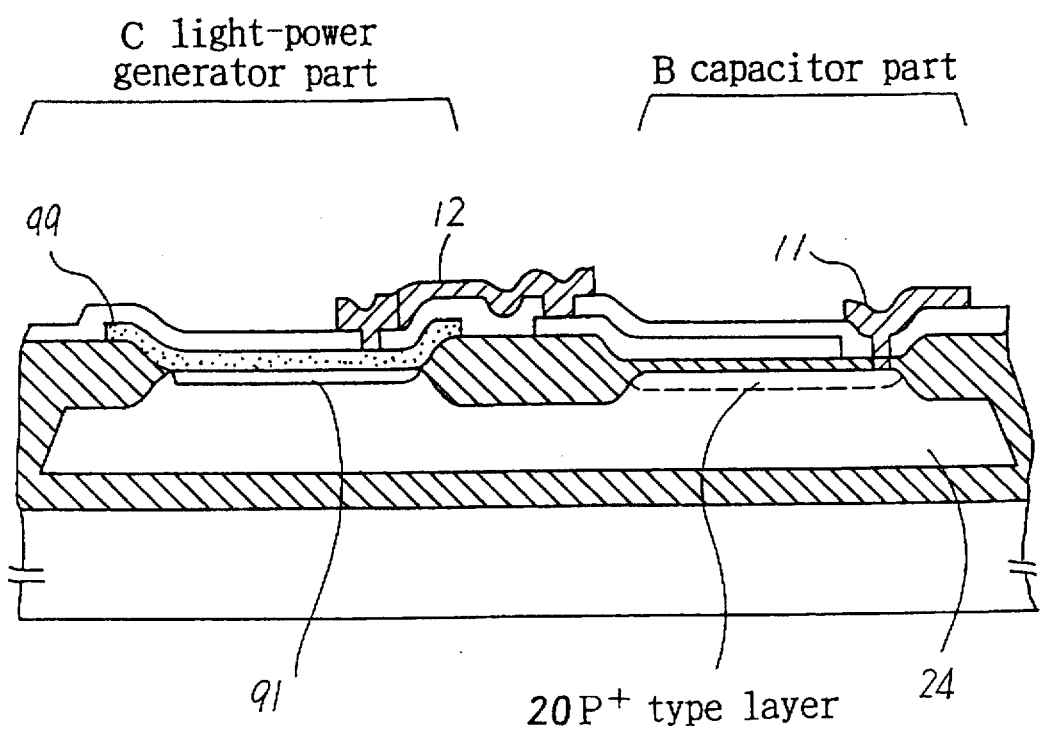
FIG. 9 is a schematic sectional view showing a light power generation element and capacitor in a pair in a semiconductor integrated circuit device according to a fourth embodiment of the present invention.

FIG. 9 shows a schematic sectional view of a rectifier and a light-power generator/capacitor in a pair, which constitute a semiconductor integrated circuit device according to a fourth embodiment of the present invention. At the time of receiving a light simultaneously when an n+ type layer 91 introduced from a polysilicon electrode 92 in self-adjustment is connected to a capacitor part B as a rectifying element, a voltage or a current can be taken out as a power generation element.

Figure 10A:
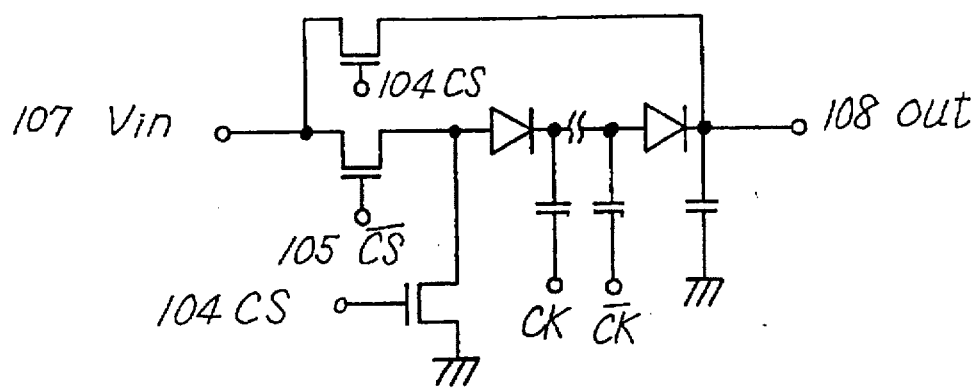
FIG. 10 is a schematic electronic circuit diagram of the semiconductor integrated circuit device according to the fourth embodiment.
Figure 10B:
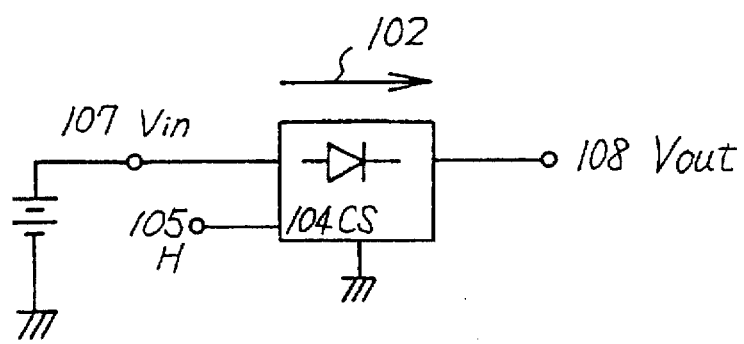
Figure 10C:
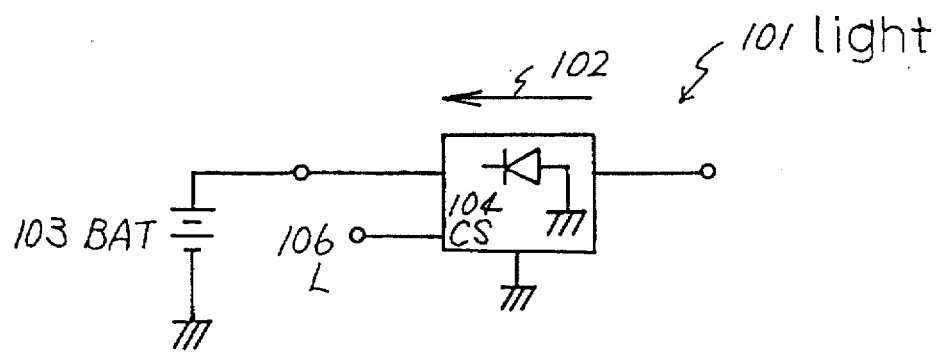
Figure 11A:
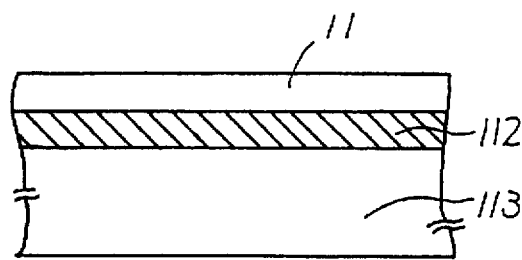
FIG. 11 is a sectional view showing the order of manufacturing steps representative of a method of manufacturing a semiconductor integrated circuit device according to a fifth embodiment of the present invention.
Figure 11B:
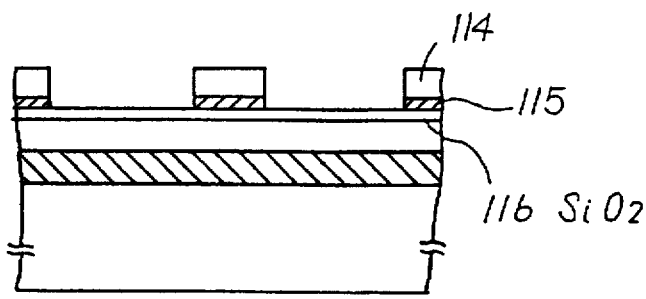
Figure 11C:
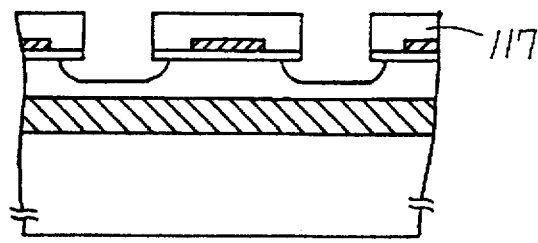
Figure 11D:
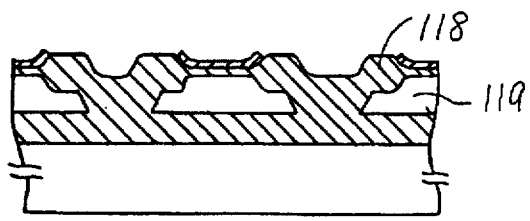
Figure 11E:
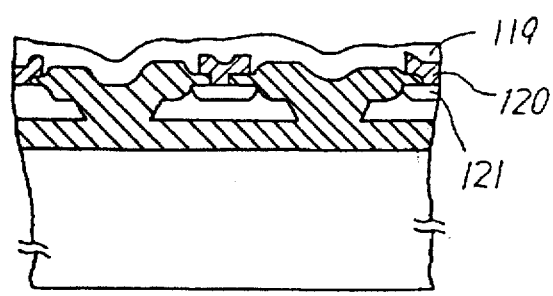

FIG. 10(a) shows a schematic block diagram of an electric circuit of a semiconductor integrated circuit device according to the present invention. As a changeover switch in the circuit, a MOS transistor CS 104 and a CS105 are arranged, and a rectifying element is connected in series as a charge pump circuit and raises a voltage only when a signal is input to the CS 105 (this means that the CS 105 is automatically selected only when the CS signal is not input) (FIG. 10(b)). When the CS is not input, about six rectifying elements are connected in series for the most period of time (when a charge secondary battery of Li or a capacitor type is assumed. The proper number, for example, corresponding to a case of connecting in series or a case of a battery requiring an entirely different charging voltage), and all the rectifying elements are then connected to charge the secondary battery BAT. 103 (FIG. 10(c)). With the construction thus organized in the present invention, in the electric circuit having a booster circuit such as an EL light emitting element drive, it is unnecessary to account for the consumption of a battery, the frequent exchange of the battery, and the like, resulting in a remarkable improvement in convenience.

FIG. 11 shows a sectional view representative of the order of a manufacturing process in a method of manufacturing a semiconductor integrated circuit device according to a fifth embodiment of the present invention. An SiN layer 115 is formed on a single crystal Si layer 11 which is disposed on an SOI substrate formed of a silicon substrate 113 and insulating layer 112, and is then subjected to region patterning by means of a photo resist 114 (FIG. 11(b)). Subsequently, it is subjected to region patterning by means of a photo resist 117 in such a manner that the single crystal Si layer 11 is partially removed to the extent that the layer 11 does not attain to a first coating $SiO_2$ insulation layer 112 (FIG. 11(c)). Thereafter, a LOCOS oxide film 118 is formed after an oxide process has been performed to form Si layers 119 individually separated from each other followed by the formation of impurity regions 121, wiring 120 and passivation 122.

Figure 12A:
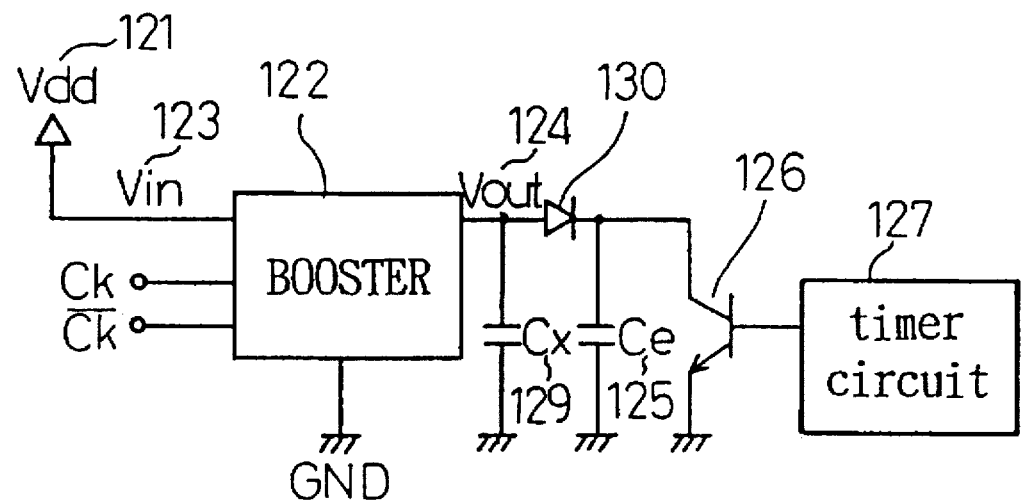
FIG. 12 is a schematic block diagram showing an EL light emitting element drive circuit according to a sixth embodiment of the present invention.
Figure 12B:
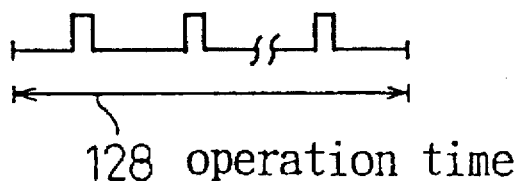

FIG. 12 shows a schematic block diagram of an EL light emitting drive circuit according to a sixth embodiment of the present invention. A booster 122 is formed by a semiconductor integrated circuit device of the charge pump type as described above, where a rectifier and a capacitor in a pair are disposed in series. In this embodiment, a voltage of approximately 100 V for Vout 124 and a charge carrying capability of $1 \times 10^{-5}$ F/sec are required in order to obtain a sufficient luminance, assuming that an EL element Ce 125 has the capacity of several nF and the charging and discharging period set by a timer circuit ranges from 2 kHz to 3 kHz. It is required that the number of stages each consisting of the paired rectifier and capacitor is 40, the capacity of one capacitor is approximately 10 pF, and the CK and $\overline{CK}$ have 1 MHz to 4 MHz when Vin connected to Vdd is 3 V. When Vin is 1.5 V, the number of stages is approximately 80. An external capacitor Cx 129 connected to an anode of a diode 130 at a final stage requires the capacity of several nF which is the same extent as that of an EL element Ce 125. At this time, for example, in the voltage amplitude of the CK and the $\overline{CK}$, the CK is subject to amplification by a minus voltage with respect to the GND so that the number of stages can be sufficiently reduced by half with the same step-up ratio.

Moreover, in such a charge pump circuit, until a desired Vout voltage can be obtained from the time that the CK input starts, it takes a long time. This rise time is 10 Msec to several hundred msec, however, and in order to prevent this time, even when the timer circuit does not operate, the booster circuit is actuated, for example, once every several seconds to several minutes in such a manner that the Cx and Ce are pre-charged to allow the rise time to be shortened with convenience.

Figure 25:
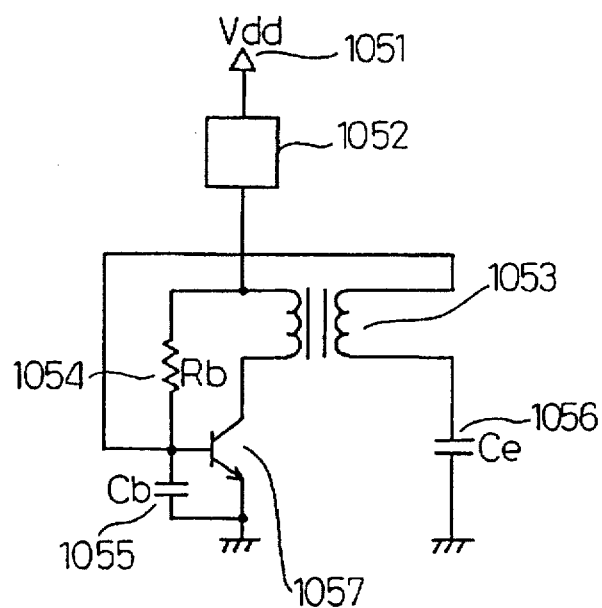
FIG. 25 is a schematic circuit diagram showing one example a conventional EL element drive circuit.
Figure 26:
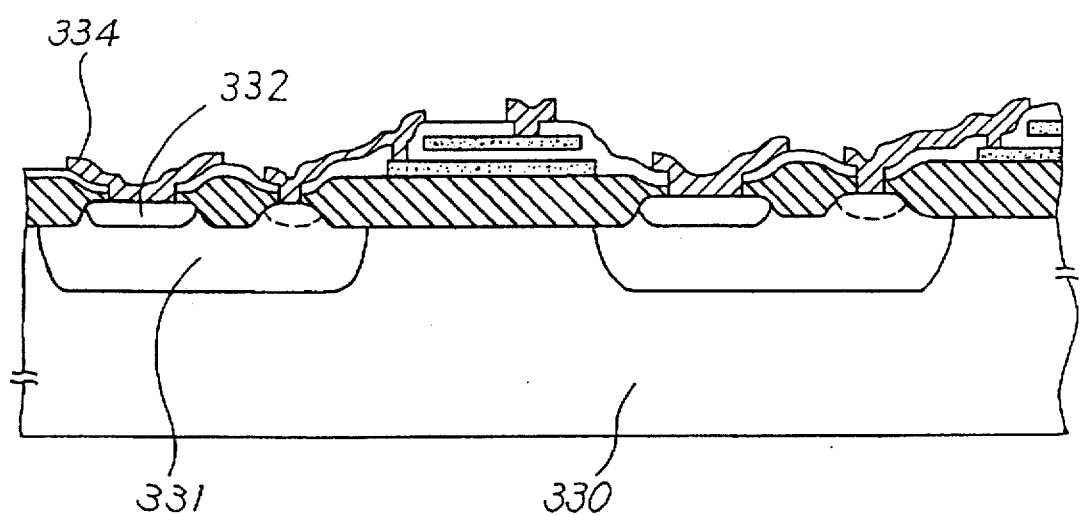
FIG. 26 is a schematic sectional view showing a conventional semiconductor integrated circuit device using a p-n junction arranged on a single substrate.
Figure 27:
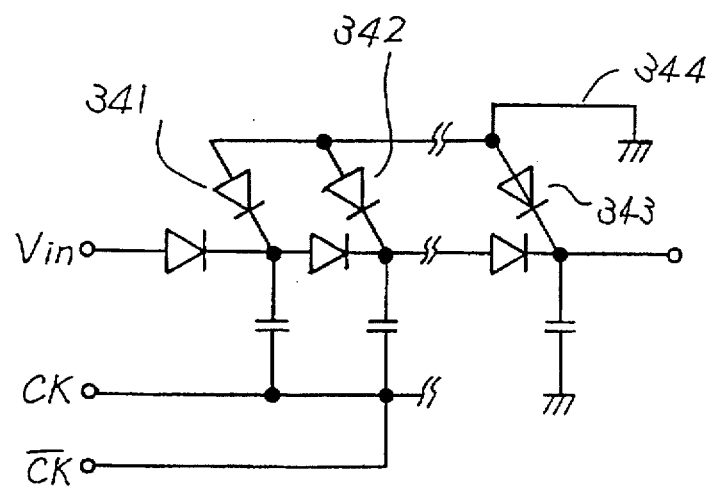
FIG. 27 is a schematic circuit diagram showing the conventional semiconductor integrated circuit device using a p-n junction arranged on a single substrate, which has been considered discretely.
Figure 28:
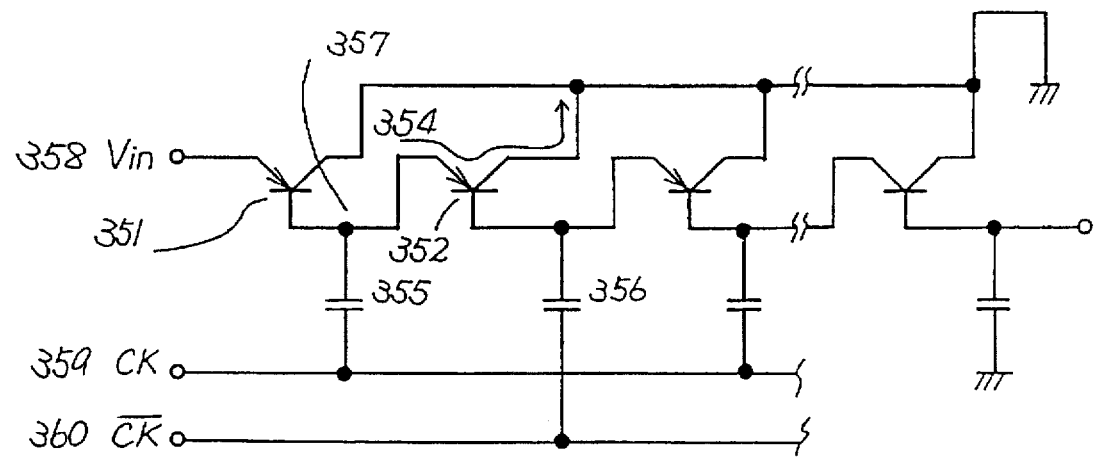
FIG. 28 is a schematic circuit diagram showing the conventional semiconductor integrated circuit device using a p-n junction arranged on a single substrate, in view of an actual operation.

FIG. 25 shows an example of a conventional EL element drive circuit. In FIG. 25, reference numeral 1052 is a timer circuit and 1056 is the EL element. As described above, a transformer 1053 has the problems as to its size and the electromagnetic harmonic. In addition, a self-oscillating circuit consisting of an npn transistor 1057, a capacitor Cb 1055 and a resistor Rb 1054 for driving the transformer has the increased self consumption power such as several mW, and its efficiency is remarkably lowered. It is apparent from the fact that these problems are completely solved with application of the present invention that the invention is successful in meeting the desired objectives.

Figure 13:
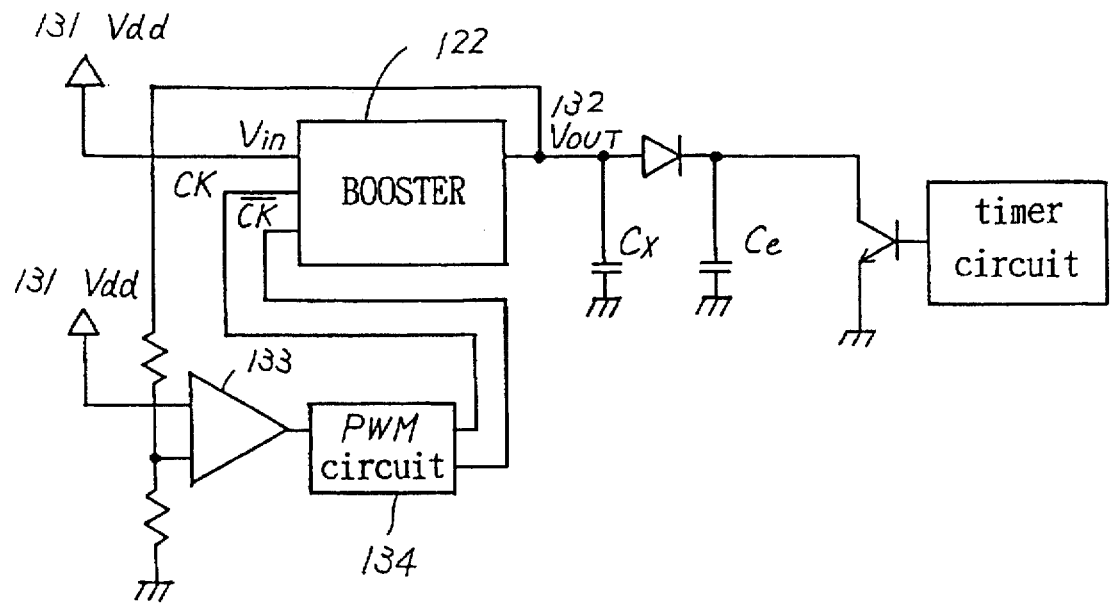
FIG. 13 is a schematic block diagram showing an EL light emitting element drive circuit according to a seventh embodiment of the present invention.
Figure 14:
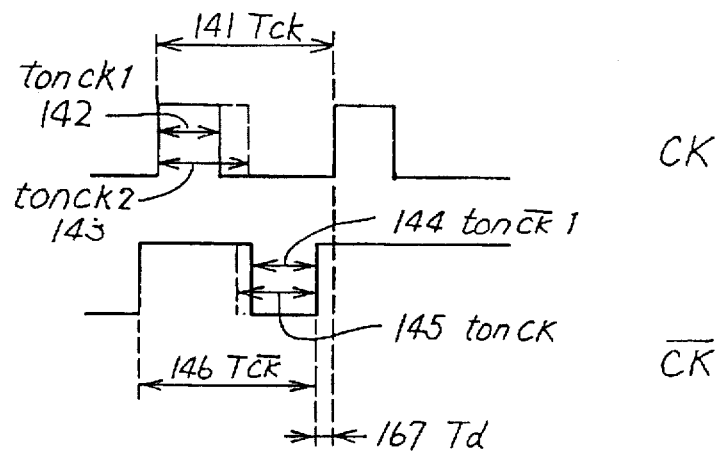
FIG. 14 a schematic diagram showing an input signal according to the seventh embodiment.

FIG. 13 shows a schematic block diagram of an EL light emitting element drive circuit according to a seventh embodiment of the present invention. There are many cases that Vdd 131, as described above, is 1.5 V, 3.0 V or 5.0 V, or a volt supplied from a power source of 12 V. However, the dispersion of 5% to 10% always occurs. Still more, when the voltage is supplied from a battery, the remarkable voltage difference occurs for a duration from an initial time to a discharge time. In this embodiment, the output voltage of the Vout 132 is monitored by a comparator 133 having a reference voltage, and the duty ratio (on/off ratio, that is, tonck1 142 and Tck 141 in FIG. 14) of the CK signal and the $\overline{CK}$ signal is changed through a PWM (pulse wave modulation) circuit 134 as shown by a tonck2 143, in such a manner that a charge transfer efficiency is changed to keep a constant the luminance of the EL. When the voltage drops, on-state time is made long. Moreover, even though the PWM circuit is replaced by a circuit which changes a frequency of the CK such as a VCO (voltage control oscillator), the same effect is obtained. Even in the case where the booster circuit is of the switched capacitor type, the effects of this embodiment are entirely the same.

Figure 15:
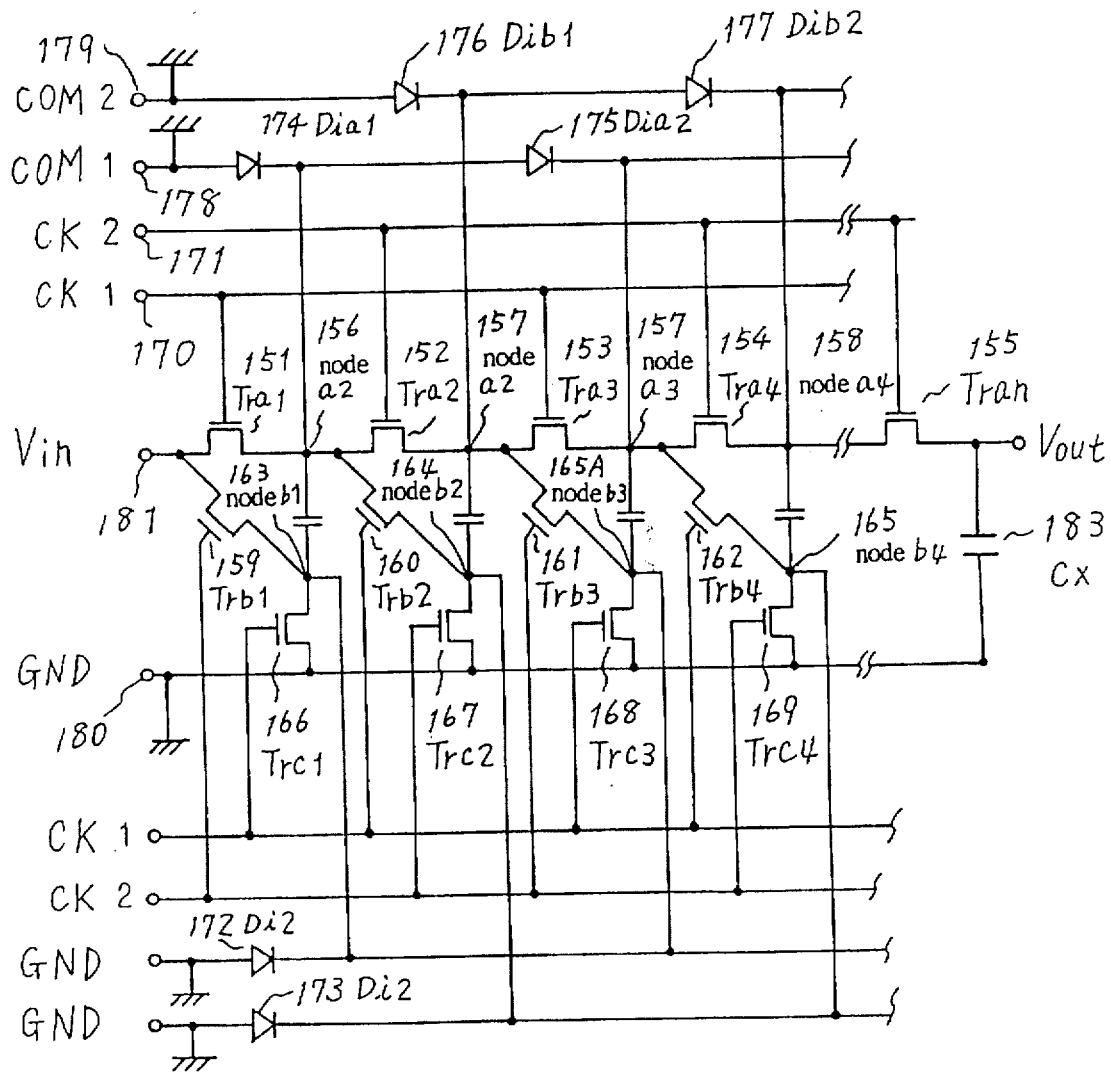
FIG. 15 is a schematic electronic circuit diagram showing a semiconductor integrated circuit device with a step-up function according to an eighth embodiment of the present invention.
Figure 16:
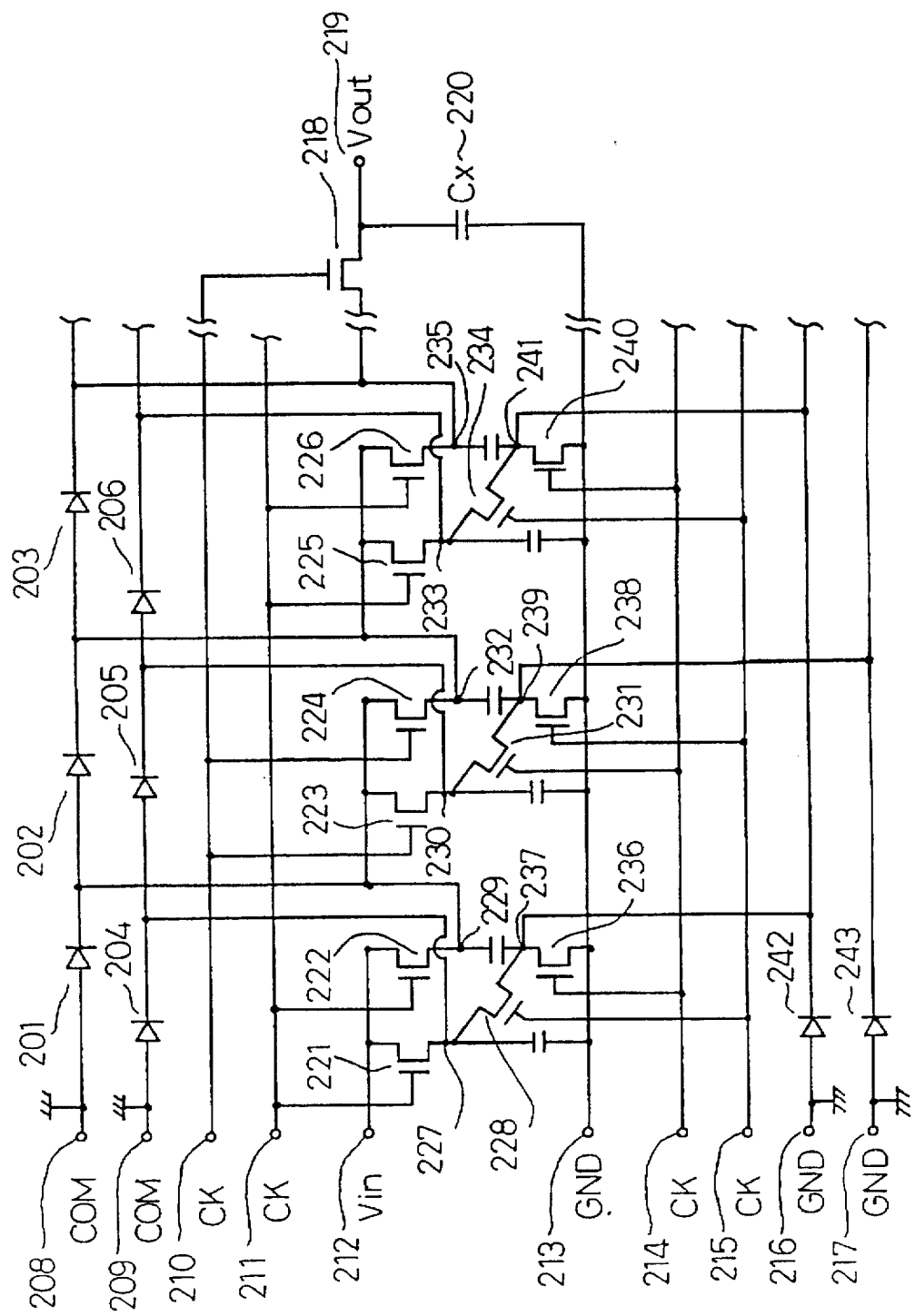
FIG. 16 is a schematic electronic circuit diagram showing the semiconductor integrated circuit device with a step-up function according to the eighth embodiment of the present invention.

FIGS. 15 and 16 show a schematic block diagram of anelectric circuit of a semiconductor integrated circuit device having a boosting function according to an eighth embodiment of the present invention. This is an example that constitutes the booster circuit of the switched capacitor type. First, the general booster circuit of the switched capacitor type will be described.

FIG. 24 shows a principle construction of the booster circuit of the Fibonacci type, and if a circuit consisting of a Tra1 1051, a Trb1 1052, a capacitor 1055, and a Trc1 1053 constitutes one block, in the case where n stages of this circuit are connected, an output voltage Vout is represented by the following expression.

$$Vout = Fib(n+1) \cdot Vin - Rsc \cdot Iout$$

Herein, Rsc means an output resistance and Fib function is shown as follows.

$$Fib(0)=0, Fib(1)=1$$

$$Fib(n)=Fib(n-2)+Fib(n-1)$$

That is, boosting operation can be made with the number of stages (the number of paired rectifying elements and capacitors.) which is remarkably less than that of the charge pump type. However, it is supposed that the MOS transistor in this circuit is an ideal switch, however, in fact it is difficult to realize its operation within a monolithic semiconductor integrated circuit device. This is because, for example, the voltage of a CK1 given to a gate must be higher than that of a node 1056 in order to turn on a transistor Tra1 1052. The first stage satisfies this condition, however, because the voltage of the node at the rear stages is a boosted voltage, the transistor cannot actually be turned For that reason, according to the present invention, a COM for a CK1 and a CK2 is constituted by a COM1 and a COM2 as shown in FIG. 15, and then they are separated from the GND by diodes, respectively. Moreover, the COM1 and the COM2 are connected to each node and subjected to backup by diodes, respectively. With such an organization, the GND of the boosting system and the COM of the CK system are separated from each other by the diode backup to form other voltage inclination systems, thereby actually enabling the realization.

FIG. 16 shows an example in which the present invention is applied to a longitudinal connection type switched capacitor booster circuit. The circuit of this type enables boosting of 2m times with use of (2m+1) capacitors and (4m+1) transistors. As shown, this circuit can be realized with the same diode backup.

Figure 17A:
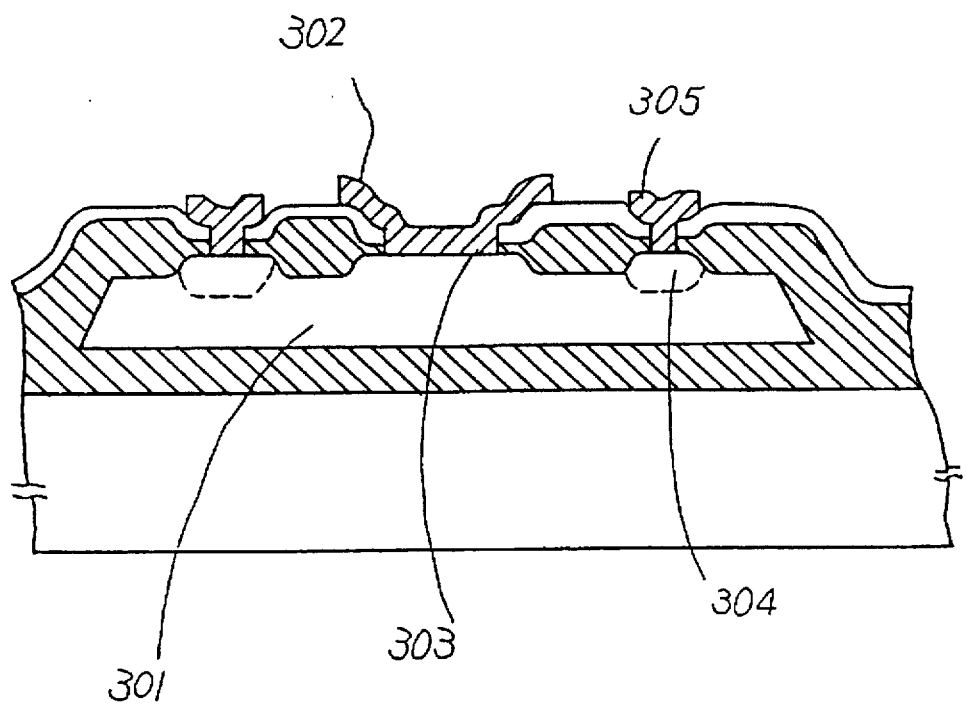
FIG. 17 is a schematic sectional view showing a rectifying element in a semiconductor integrated circuit device according to a ninth embodiment of the present invention.

FIG. 17(a) shows a schematic sectional view of a rectifying element in a semiconductor integrated circuit device according to an ninth embodiment of the present invention. In the figure, an excellent Schottky junction portion 303 is obtained by bringing an opening of an n-type layer 301 having N+ regions 304 and electrodes 305 in contact with an anode electrode 302 and by conducting a proper treatment (surface treatment of the opening and heat treatment, for example, from 400° to 600° C. after contact with Al) in a semiconductor process manner when an electrode is made of Al (aluminum). Thus, by constituting a so-called Schottky diode as a rectifying function element, a rectifying element without formation of a p+ type layer in an anode region is obtained.

Figure 17B:
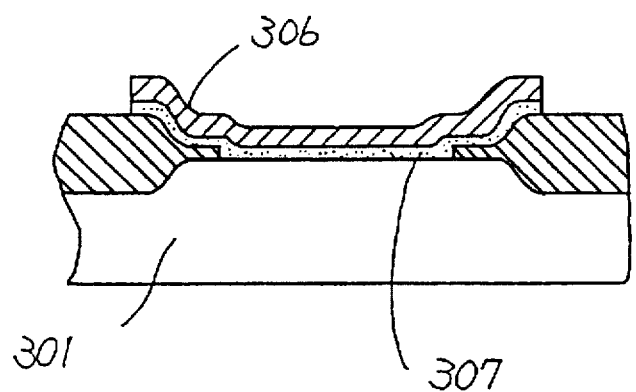

FIG. 17(b) shows an enlarged sectional view of a Schottky junction portion. In the figure, it is shown that Al is brought in contact with the surface of N—Si not directly but through a Schottky metal 307 as a barrier metal directly connected to an electrode 306. Chromium (Cr), molybdenum (Mo), platinum (Pt), tungsten (W) or the like is preferably used as a Schottky metal. The metal selected for use depending upon the desired Vf of the diode and the reverse leakage. In this example, it is recommended that, for example, Pt or W are used at a thickness of several 1000 Å. In addition to the embodiment of the semiconductor integrated circuit device of the present invention as described above, with such a structure, the Vf of the standard p-n junction is approximately 0.6 V whereas the Schottky diode is approximately 0.4 V to 0.5 V, thereby realizing a booster circuit with a reduced loss. Moreover, the recent tendency in electric circuits has been to lower the standard power voltage when using semiconductor integrated circuit devices, for example, from 5 V to 3 V, furthermore from 3 V to 1.5 V. In fact, boosting of the Vin at the time of a power voltage of 1.5 V can be first achieved by this embodiment with great convenience.

Figure 18:
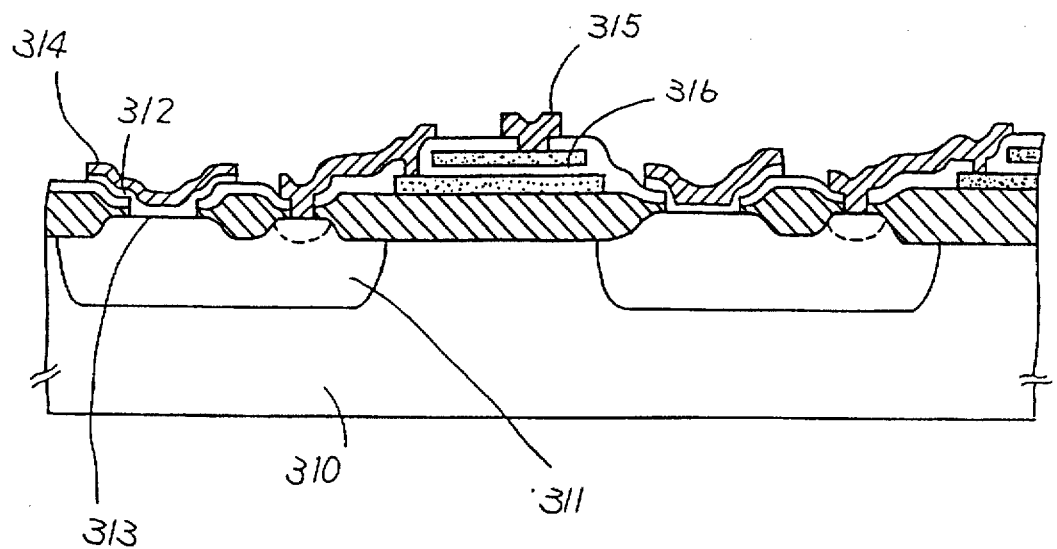
FIG. 18 is a schematic sectional view showing a semiconductor integrated circuit device of the ninth embodiment of the invention, which has been applied not to a SOI substrate but to a single standard p-type substrate 310.
Figure 19:
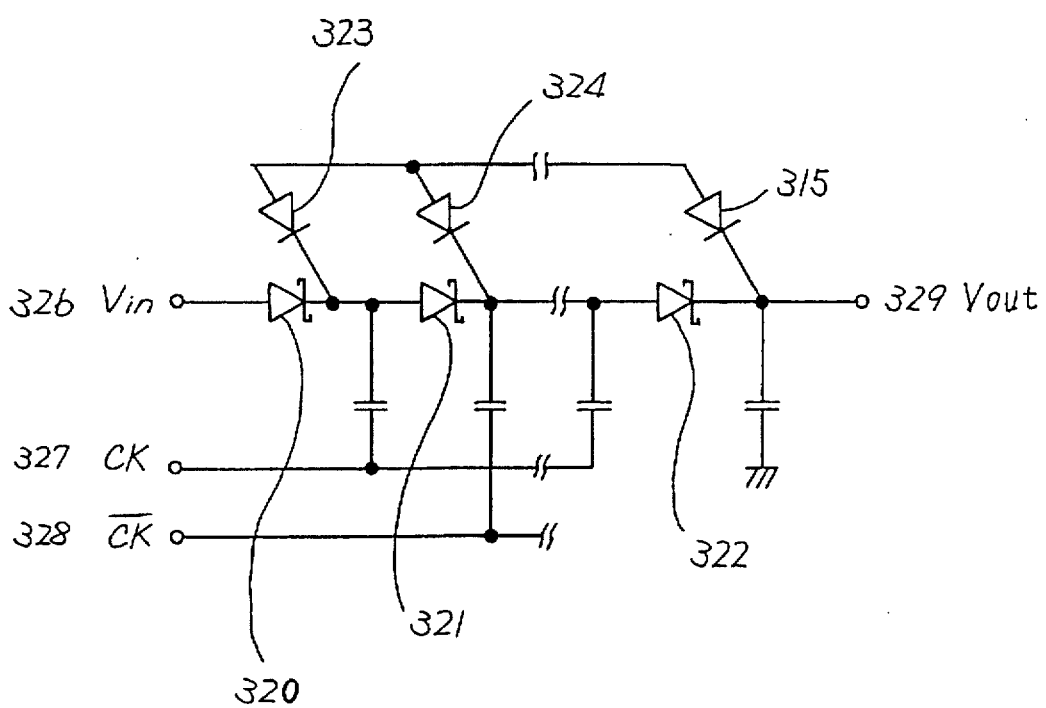
FIG. 19 a schematic electronic circuit diagram showing a semiconductor integrated circuit device according to the ninth embodiment of the invention, which has been applied to a single substrate as one example.
Figure 21:
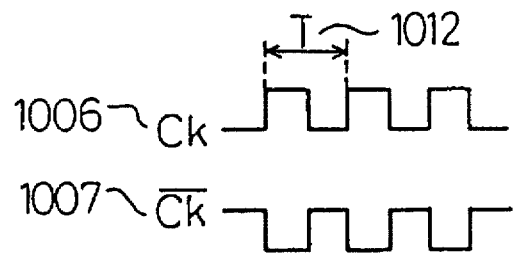
FIG. 21 is a schematic diagram showing a CK and a CK in the conventional booster circuit.

FIG. 18 shows an example in which this embodiment is applied not to an SOI substrate but to a standard p type substrate 310. As shown in this example, not a p-n junction but a Schottky junction is used as a rectifying element whereby a circuit is structured as shown in FIG. 19, enabling boosting. In other words, in the Schottky junction, a minority carrier is not injected in a Schottky junction portion 313 of a Schottky metal 312 (underlying the anode electrode 314) which corresponds to a base (n-type layer 311) and an emitter layer so that a transistor is inoperative. Moreover, in this case, although a p-n diode Dn 325 at a final stage must withstand a final boosted voltage, this is advantageous because of the normal p-n junction. That is, the Schottky diode which is disadvantageous in view of a withstand voltage (leak current) is satisfactory to withstand only a power voltage for one stage as described above.

Figure 29A:
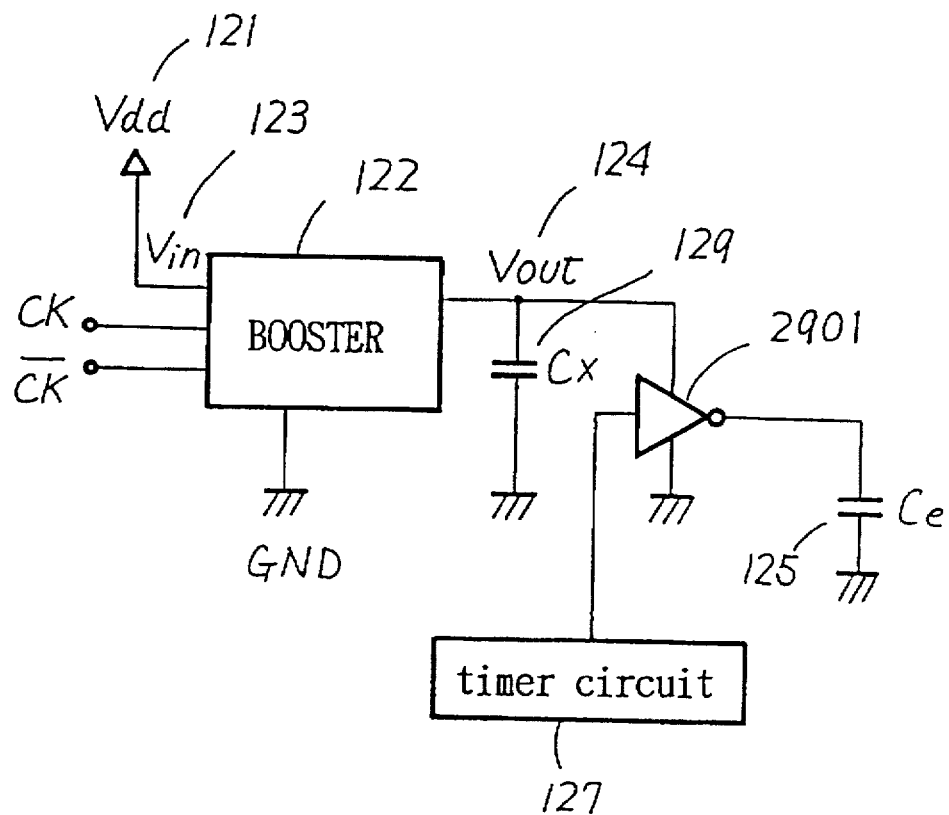
FIG. 29 is a schematic block diagram showing an EL light emitting element drive circuit according to a tenth embodiment of the present invention.
Figure 29B:
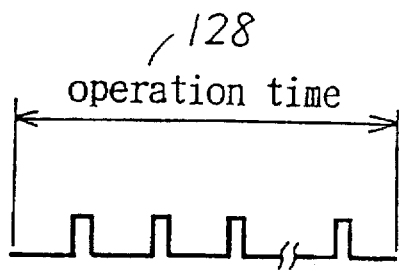

FIG. 29 shows a schematic lock diagram of an EL light emitting element drive circuit according to a tenth embodiment of the present invention. A booster 122 is constituted by a semiconductor integrated circuit of the above-described charge pump type in which a rectifier and a capacitor in a pair are arranged in series. In this embodiment, an output boosted by the booster is applied to an EL element Ce 125, and in order to emit a light from the EL element, it is necessary that the output is applied at a given time interval, thereby allowing a charge stored in the EL element to be discharged. The application and discharge of this boosted output is made by use of an invertor 2901 with the result that a charge which has been carried by the booster during discharge of the EL element can be used effectively without discarding the charge to the exterior in vain.

Further, the timing when the boosted output is applied to the EL element and also discharged is made by an output from a timer circuit 127. If the duty ratio of this timing is set to 5–15%, a frequency of the applying and discharging cycle can be heightened. As a result, the luminous luminance of the EL light emitting element can be satisfactorily elevated.

Furthermore, because the invertor 2901 which performs applying and discharging of the boosted output requires a high withstand voltage of 50–100 V, it is constituted by a MOS transistor with a DDD (double diffused drain) structure or a LOCOS drain structure.

Furthermore, a high integration can be conducted by disposing the invertor 2901 on the same substrate together with the booster 122, a capacity element Cx 129 and a timer circuit 127, as a result of which the size of a chip can be downsized and an electronic equipment to which this circuit is applied can be made small-sized.

Figure 30A:
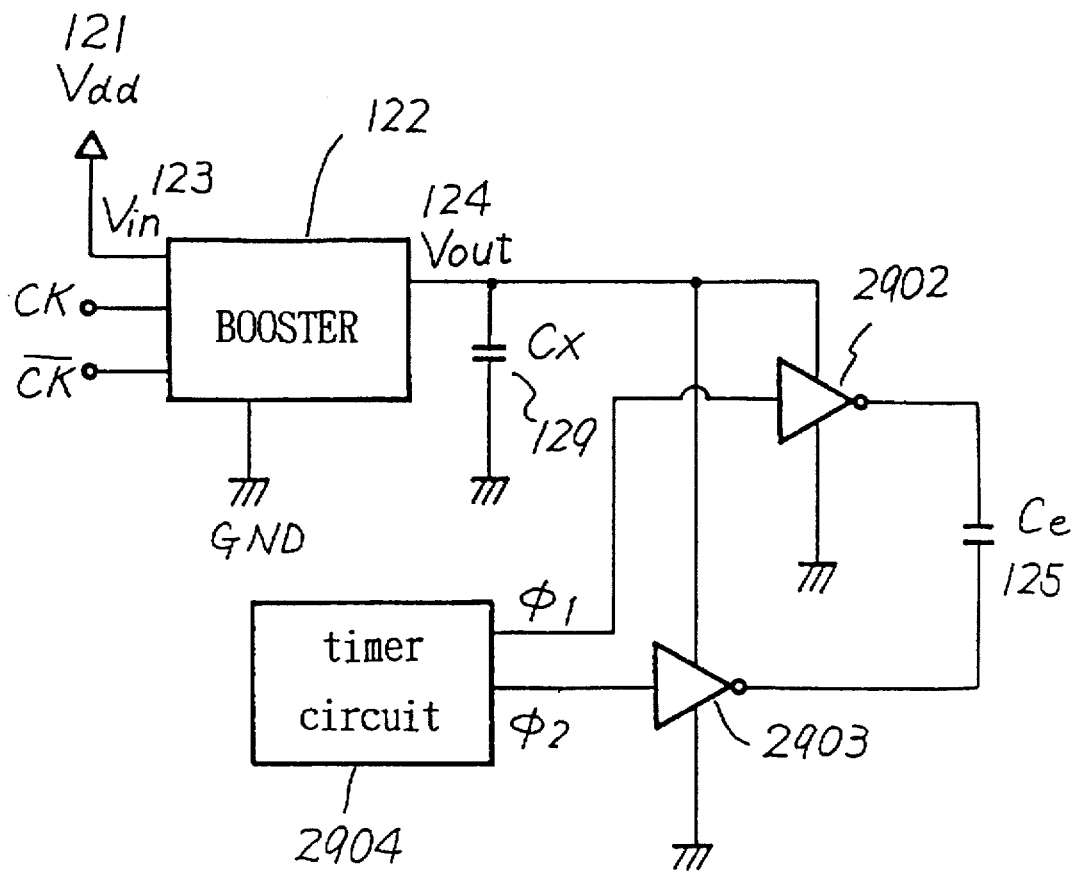
FIG. 30 is a schematic block diagram showing an EL light emitting element drive circuit according to an eleventh embodiment of the present invention.
Figure 30B:
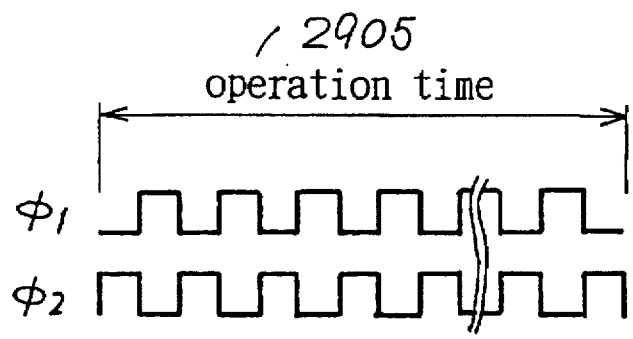

FIG. 30 shows a schematic block diagram of an EL light emitting element drive circuit according to an eleventh embodiment of the present invention. A booster 122 is constituted by a semiconductor integrated circuit of the above-mentioned charge pump type in which a rectifier and a capacitor in a pair are arranged in series. This circuit is of the type that the output boosted for emitting a light from an EL element is applied from both sides of the EL element by use of two invertors 2902 and 2903. The timer circuit 2904 generate the signal $\phi_1$, $\phi_2$ inputted to the inverter 2902 and 2903 respectively, to supply alternatively the boosted output voltage to both side electrodes of the EL element. Thus, in the case of using a method of applying the boosted output different in phase from both side electrodes of the EL element, Vout 124 necessary for obtaining a sufficient luminance is a voltage of approximately 50 V and the sufficient charge carrying capability is $2\times10^{-5}$ F/sec. When Vin connected to Vdd is 3 V, the number of stages each consisting of a rectifier and a capacitor in a pair is approximately 20, the capacity of one capacitor is approximately 10 pF, the frequency of CK and CK is 2 MHz to 8 MHz. With such an organization, a boosted voltage necessary for emitting a light from the EL element with a sufficient luminance can be lowered, and the area of the booster 122 can be made small.

Figures 31A, 31B:
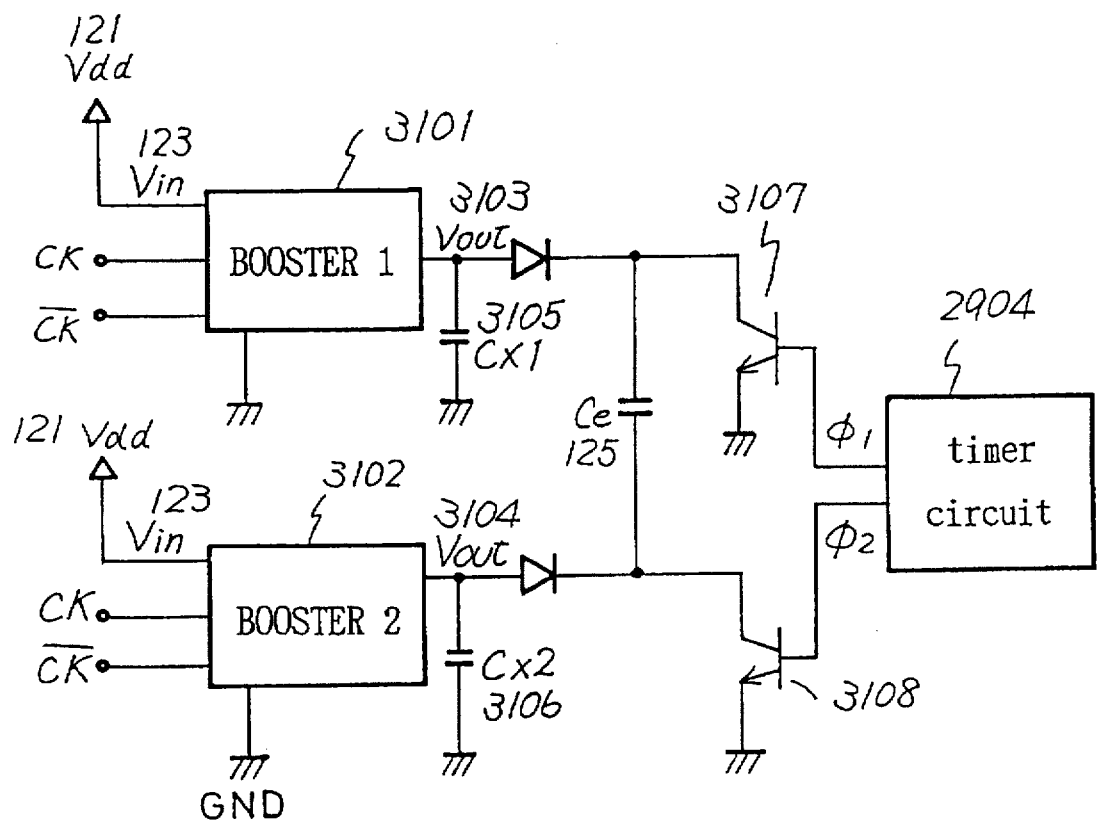
FIG. 31 is a schematic block diagram showing an EL light emitting element drive circuit according to a twelfth embodiment of the present invention.

FIG. 31 shows a schematic block diagram of an EL light emitting element drive circuit according to a twelfth embodiment of the present invention. Boosters 3101 and 3102 are constituted by the semiconductor integrated circuit of the above-described charge pump type in which a rectifier and a capacitor in a pair are arranged in series. NPN transistor 3107 and 3108 is inputted the signal $\phi_1$ and $\phi_2$ which is different is phase respectively from the timer circuit 2904. As a method of applying a boosted output of a different phase from both side electrodes of an EL element, when the two boosters 3101 and 3102 are used, Vout 3103 and 3104 necessary for obtaining a sufficient luminance are approximately 50 V, respectively, and a sufficient charge carrying capability is $1\times10^{-5}$ F/sec. When Vin connected to Vdd is 3V, the number of stages each consisting of a rectifier and a capacitor in a pair is approximately 20, the capacity of one capacitor is approximately 10 pF, the frequency of a CK and a CK is 1 MHz to 4 MHz. With such an organization, a boosted voltage necessary for emitting a light from an EL element with a sufficient luminance can be lowered, and also a CK and CK generating unit for driving the boosters 3101 and 3102 can be operative with a lower frequency, thereby to perform a low consumption current.

FIG. 32 shows a schematic block diagram of an EL light emitting element drive circuit according to a thirteenth embodiment of the present invention. Boosters 3101 and 3102 are constituted by a semiconductor integrated circuit of the above-mentioned charge pump type in which a rectifier and a capacitor in a pair are arranged in series. As a method of applying a boosted output of a different phase from both sides of an EL element, when the two boosters 3101 and 3102 are used, rout 3103 and 3104 necessary for obtaining a sufficient luminance is a voltage of approximately 50 V, respectively, and a sufficient charge carrying capability is $1\times10^{-5}$ F/sec. When Vin connected to Vdd is 3 V, the number of stages each consisting of a rectifier and a capacitor in a pair is approximately 20, the capacity of one capacitor is approximately 10 Pf, the frequency of a CK and a CK is 1 MHz to 4 MHz. With such an organization, a boosted voltage necessary for emitting a light with a sufficient luminance can be lowered, and a CK and CK generating unit for driving the boosters 3101 and 3102 can be sufficiently operative with a lower frequency. Moreover, the outputs Vout 3103 and 3104 which have been boosted for charging and discharging a charge for emitting a light by the EL element Ce 125 are made by use of invertors 2902 and 2903 and their input signals $\phi_1$ and $\phi_2$ with the result that the charge which has been carried by the boosters for a duration when the EL element Ce 125 is discharged can effectively be used without discarding the charge to the exterior in vain, and a low consumption current can be performed.

Figure 33:
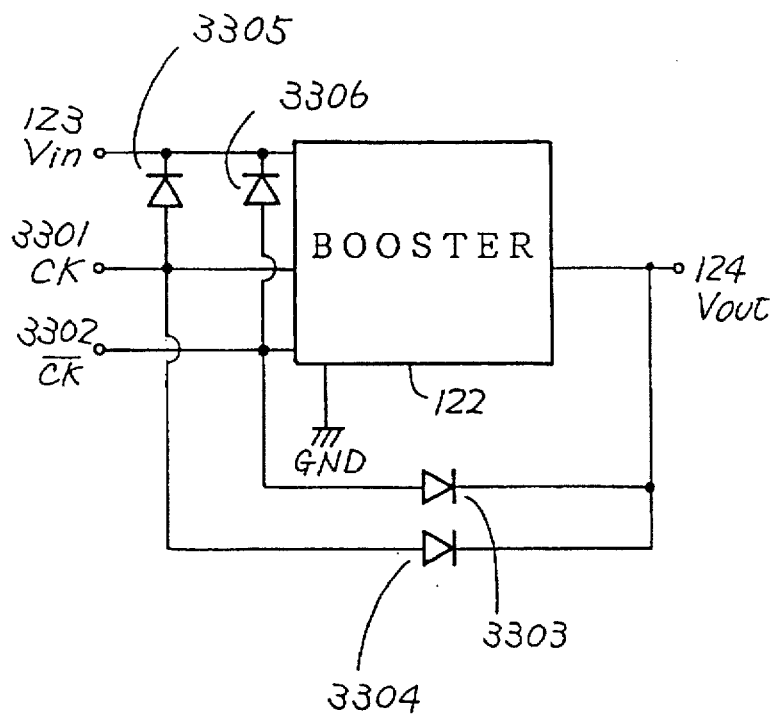
FIG. 33 is a schematic electric circuit diagram showing a step-up semiconductor integrated circuit device according to a fourteenth embodiment of the present invention.
Figure 34:
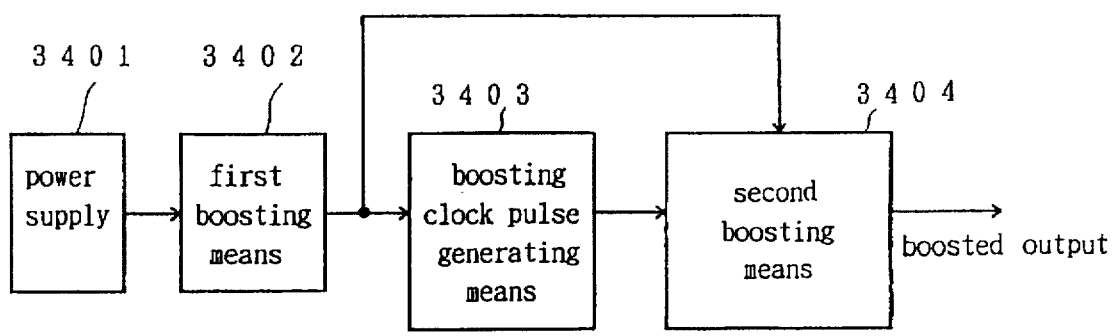
FIG. 34 is a schematic block diagram showing an example of a step-up semiconductor integrated circuit device according to the present invention.

FIG. 33 shows a schematic block diagram of a boosting charge to the exterior in vain, and a low consumption current can be performed.

FIG. 33 shows a schematic block diagram of a boosting semiconductor integrated circuit according to a fourteenth embodiment of the present invention. A booster 122 is constituted by a semiconductor integrated circuit of the above-mentioned charge pump type in which a rectifier and capacitor in a pair are arranged in series.

In this embodiment, high-voltage breakdown diodes 3303,3304, 3305 and 3306 have a breakdown voltage which is set tohigher than a voltage necessary for light emitting of an EL element and also lower than a breakdown voltage of a capacity element at an end within the booster.

For example, in the case of emitting a light from the EL element at a voltage of approximately 100 V, a normally useable electric field intensity of the capacity element at the end within the booster is 3 MV/cm when an oxide silicon film is used as an insulator, and it is equivalent to the thickness of the film being 300 nm. When an electric field of 6 MV/cm isapplied to the oxide silicon film with such a film thickness, a minute current starts to flow in the film with the result that deterioration is advanced. For that reason, the breakdown voltage of the high-voltage breakdown diodes 3303, 3304, 3305 and 3306 must be set to a value less than the electric field of 6 MV/cm and is set to approximately 120 V to 180 V, in the case where the oxide silicon having its film thickness of 300 nm is used as an insulator.

A high-voltage breakdown diode 3305 is connected between an input terminal Vin 123 and a terminal CK 3301 of the booster 122 which constitutes the boosting semiconductor integrated circuit so that the terminal Vin has a voltage. Simultaneously, a high-voltage breakdown diode 3306 is connected between the input terminal Vin 123 and the terminal CK 3302. Moreover, a high-voltage breakdown diode 3304 is connected between an output terminal Vout 124 and the terminal CK 3301 so that the terminal Vout has a low voltage, and simultaneously a high-voltage breakdown diode 3303 is connected between the output terminal Vout 124 and the terminal CK 3302, as a result of which the respective elements can be prevented from being broken by noises from the exterior and other unnecessary static electricity without use of an external additional protecting circuit. In the case of a device including a large number of capacitors as in the booster of the present invention, there is a high probability that elements are broken by applying unnecessary static electricity thereto, and in this embodiment, the above-described protecting device is built in the booster to effectively prevent the breakdown of the elements, and handling of the device is facilitated.

Figure 35:
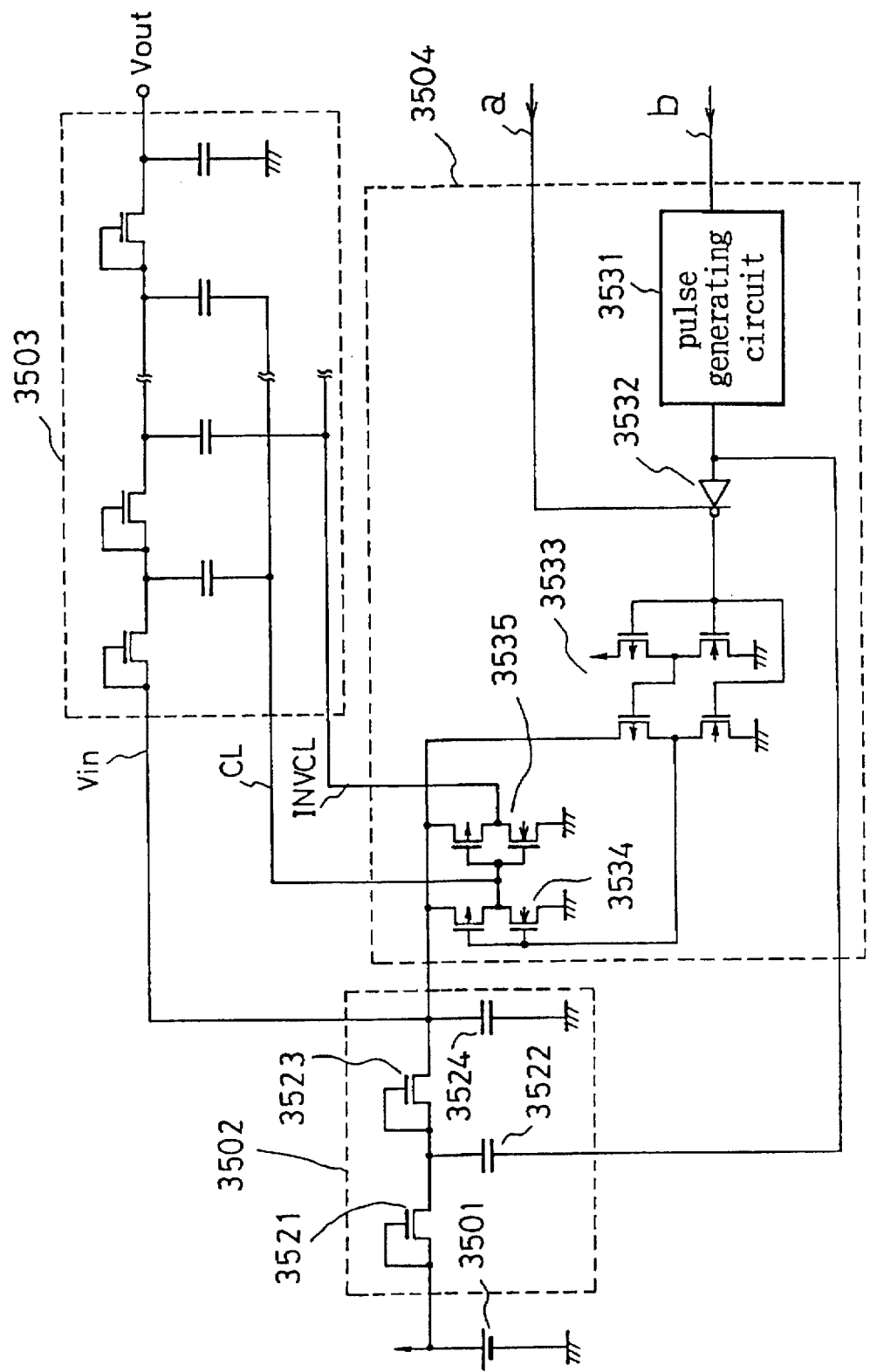
FIG. 35 is a schematic circuit diagram showing a step-up semiconductor integrated circuit diagram according to a fifteenth embodiment of the present invention.

FIG. 35 shows a schematic electric circuit diagram of a boosting semiconductor integrated circuit according to a fifteenth embodiment of the present invention. A voltage of a power source 3501 which is constituted by a primary battery or a secondary battery is raised to a double voltage by a first booster circuit 3502. The voltage thus double boosted is stored in a smoothing capacitor 3524. The double voltage stored in the smoothing capacitor 3524 is then supplied to an input terminal Vin of a second booster circuit 3503 and a boosting pulse generating circuit 3504 for driving the first and second booster circuits 3502 and 3503.

The boosting pulse generating circuit 3504 outputs a boosting clock pulse having a voltage level of the power source 3501 to the first booster circuit 3502, and a boosting clock pulse having a voltage level double higher than the voltage of the power source 3501 to the second booster circuit 3503.

When a control line a for controlling the boosting clock pulse generating circuit 3504 becomes a VDD level, a pulse generating circuit 3531 starts to oscillate in such a manner that a boosting clock pulse having a voltage level which is identical with the voltage of the power source 3501 is outputted to a capacitor 3522 of the first booster circuit 3502. As a result, the voltage double higher than that of the power source 3501 is stored in the smoothing capacitor 3524 of the first booster circuit 3502.

Subsequently, when a control line b for controlling the second booster circuit 3531 comes to a VDD level, a gate 3532, which has obstructed the output pulse of the pulse generating circuit 3531, starts to operate so that the pulse is transmitted to a level shifter 3533. The level shifter 3533 converts the voltage level of the boosting clock pulse into a voltage double as high as the power voltage stored in the smoothing capacitor 3524 and then outputs the converted voltage to an output gate 3534. Because the power voltage of outputgates 3534 and 3535 is supplied from the smoothing capacitor 3524, a clock pulse of a voltage level double as high as that of the power source 3501 can be outputted to a clock pulse input CL of the second booster circuit 3504 and an INVCL which is inverse to the CL. The relationship in phase between the CL and the INVCL is different from each other by 180 degree.

With the circuit thus organized, a voltage different from the power voltage can be boosted, as a result of which the input Vin to the second booster circuit 3503 can be made large so that, even though the number of stages each consisting of a rectifier circuit and a capacitor in a pair is reduced, a high boosted voltage output can be obtained.

In the embodiment of FIG. 35, although an input voltage of the second booster circuit was set to the voltage double as high as the power voltage, the present invention does not limit to it, and a voltage of an arbitrary times can be used as the input voltage of the second booster circuit.

FIG. 36 shows a state where the output voltage of the second booster circuit is changed, when, assuming that the total number of stages each consisting of a rectifier circuit and a capacitor in a pair (charge pump), which constitutes the first and second booster circuits is N, the number of stages for each of the first and second booster circuits is changed, respectively, in such a manner that the total number of stages becomes N. (The amount of voltage drop caused by the rectifier circuit is ignored.)

In the table of FIG. 36, mark N denotes the total number of stages each consisting of a rectifier circuit and a capacitor in a pair for the second booster circuit, and marks (N−1, N−2, . . . ) denotes the number of stages for the first booster circuit. In the figure, for example, the meaning of 20-VDD is that a voltage twentieth times as high as a power voltage VDD is an output voltage level of the second booster circuit. As is apparent from the table, a highest boosted voltage output can be obtained when the respective halves of the total number N of the pairs are assigned to the first and second booster circuit, respectively.

Figure 37:
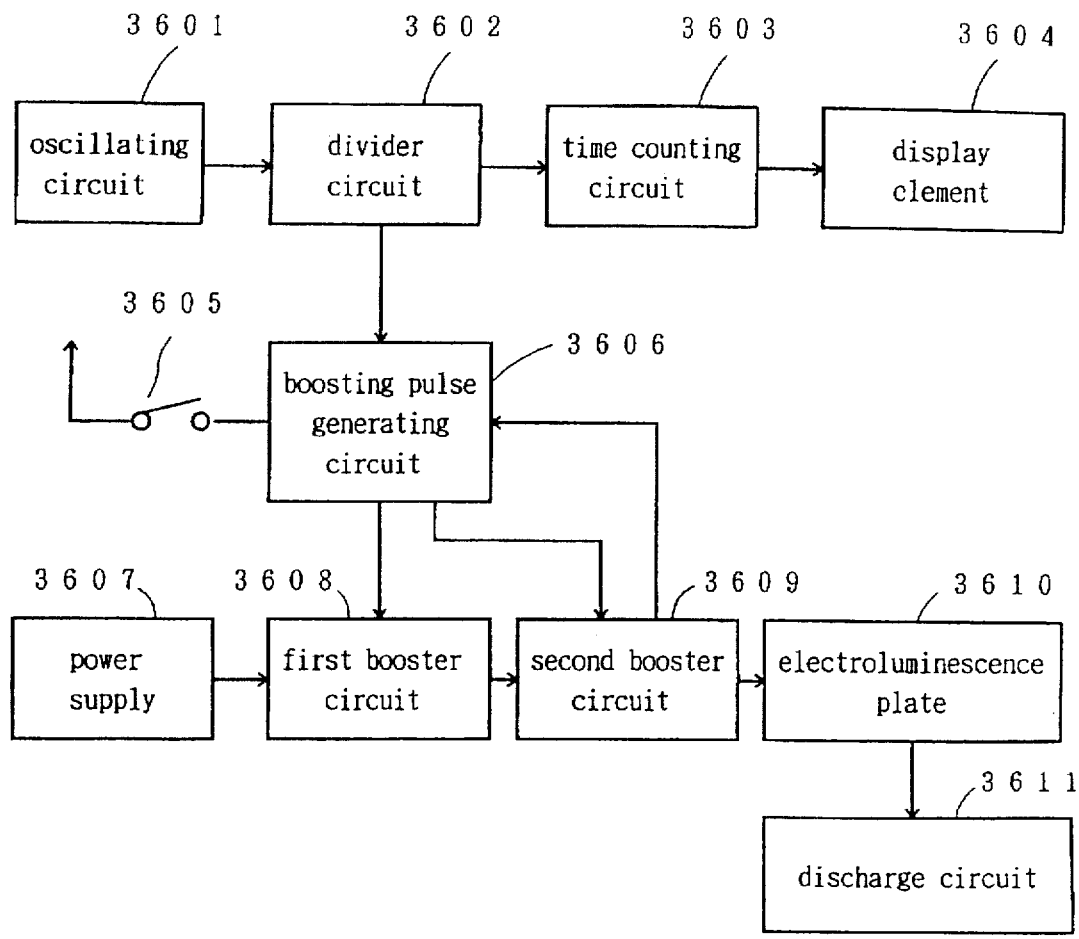
FIG. 37 is a schematic block diagram showing a step-up semiconductor integrated circuit diagram according to a sixteenth embodiment of the present invention.

FIG. 37 shows a block diagram according to a sixteenth embodiment of the present invention. This embodiment shows an example that the boosting semiconductor integrated circuit of the present invention is applied to an EL element used for lighting of a display unit for an electronic clock.

A reference signal for time counting with oscillation of an oscillating circuit 3601 is frequency divided by a divider circuit 3602. A time counting signal of 1 sec. which has been divided by the divider circuit 3602 is counted by a time counting circuit 3603, thereby producing time date. The time date of a time counting circuit 3603 is displayed by a display element 3604. The boosting semiconductor integrated circuit of the present invention is used in order to obtain a high voltage which drives an electroluminescence plate 3610 disposed at the background of the display element.

When an externally operated switch 3605 is turned on, a boosting pulse generating circuit 3606 outputs a pulse for boosting to a first booster circuit 3608 and a second booster circuit 3609 on the basis of a frequency signal from the divider circuit 3602. As a result, the electroluminescence plate 3610 is charged at the boosted high voltage. The high voltage of the electroluminescence plate 3610 is discharged at a certain frequency by a discharge circuit 3611. As a result, the display element 3604 is lightened so that a time is easily readable even in the dark.

The boosting semiconductor integrated circuit of the present invention is applied not only to an EL element for lighting of the display unit as described above, but also to an output element which requires a high voltage for driving of a motor, a buzzer and the like.

Figure 38:
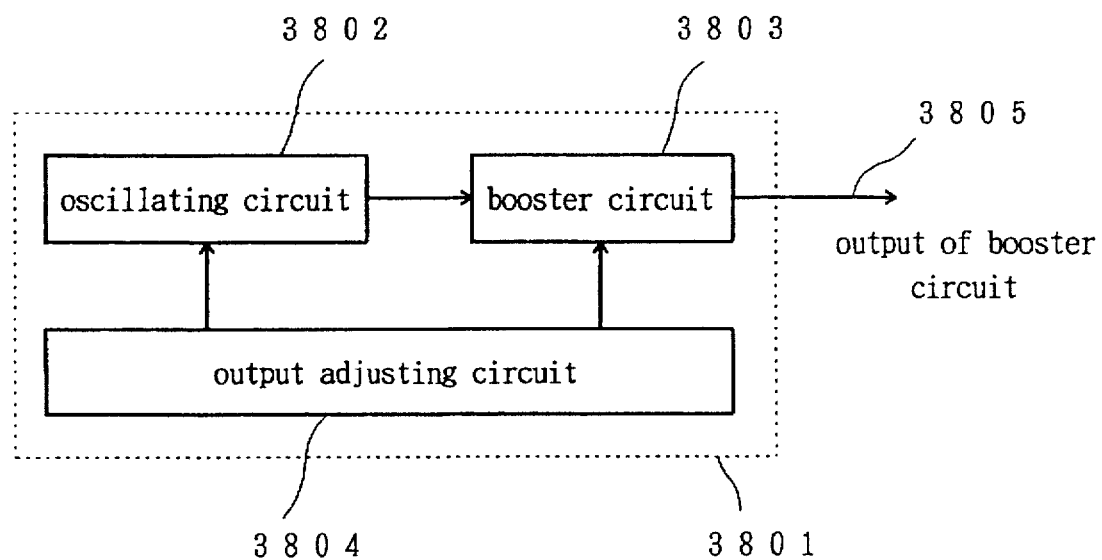
FIG. 38 is a schematic block diagram showing an example of a step-up semiconductor integrated circuit device according to the present invention.

FIG. 38 shows a block diagram of a seventeenth embodiment according to the present invention. A drive circuit 3801 is constituted by an oscillating circuit 3802, a booster circuit 3803 and an output signal adjusting circuit 3804. The booster circuit 3803 is constituted by a semiconductor integrated circuit of the above-described charge pump type in which a rectifier and a capacitor in a pair are arranged in series. The oscillating circuit 3802 generates a clock signal, and the boosting operation is conducted by the booster circuit 3803 for a period of the clock signal. The output adjusting circuit 3804 actuates a part of the oscillating circuit 3802 or the booster circuit 3803 in such a manner that a voltage, a frequency or the like of the boosted output from the drive circuit 3801 is adjusted.

Figure 39:
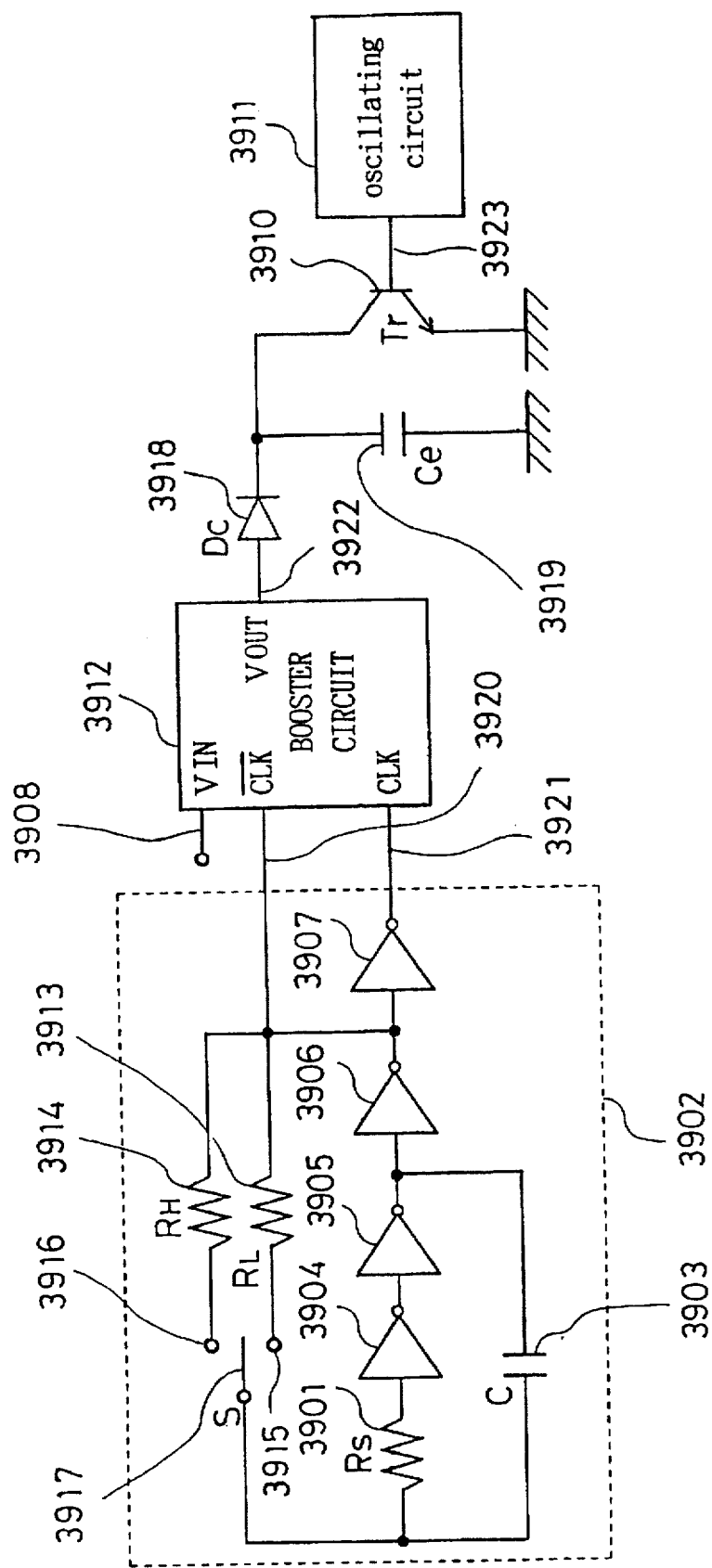
FIG. 39 is a schematic circuit diagram showing a step-up semiconductor integrated circuit device according to a seventeenth embodiment of the present invention.

In FIG. 39, an oscillating circuit 3902 is actuated by a CR oscillation, and an oscillation frequency is determined by a time constant depending upon paired C3903 and RL 4913 or paired C3903 and RH3914. A CR oscillating circuit can change an oscillating frequency easily, which is different from a crystal oscillating circuit and a ceramic oscillating circuit. By connecting a switch S 3917 to any one of a terminal 3915 and a terminal 3916, an RL 3913 and an RH 3914 can be selected. If the RL 3913 is set to a low resistance whereas the RH 3914 is set to a high resistance, the oscillating frequency can be controlled by selection of a high or low resistance. An RS 3901 represents an input protecting resistor for the invertor 3904. The square signals inverse in phase are inputted to aclock signal input terminal CLK 3921 and a CLK 3920 of a booster circuit 3912, respectively. A power voltage VDD inputted to a voltage input terminal Vin 3908 is boosted into a high voltage, and its voltage signal is charged to an EL element Ce 3919 through a diode De 3918. The Ce 3919 is also connected to a collector terminal of a transistor Tr 3910, whereas a base of the Tr 3910 is connected to another oscillating circuit 3911. The oscillating circuit 3911 applies a periodic signal to the base of Tr 3910 successively, and the Tr 3910 repeats the ON/OFF operation for a signal period of the oscillating circuit 3911. When the Tr 3910 is in an OFF state, the charge which has been charged in the Ce 3919 is held as it is, and when the Tr 3910 is changed to an ON state, then the charge which has been charged in the Ce 3919 is discharged through the Tr 3910.

The above-mentioned charge/discharge operation is repeatedly conducted so that the EL element Ce 3919 emits a light. In this embodiment, the oscillating frequency of the oscillating circuit 3902 is set to, for example, 10 KHz to several KHz whereas the frequency of a signal output from the oscillating circuit 3911 is, for example, the degree of several ten to several KHz, which is sufficiently delayed.

Figure 40:
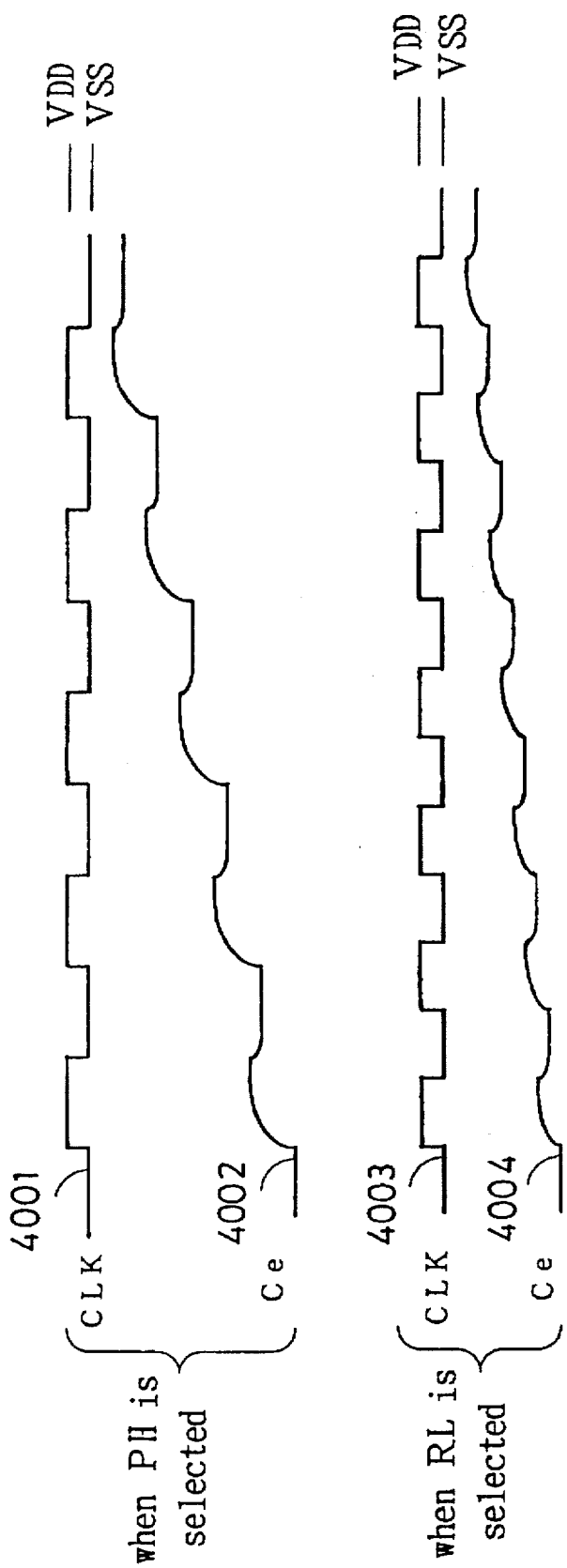
FIG. 40 is an explanatory diagram showing a clock output signal inputted to a booster circuit and a voltage waveform applied to an EL element in the seventeenth embodiment of the present invention.
Figure 41:
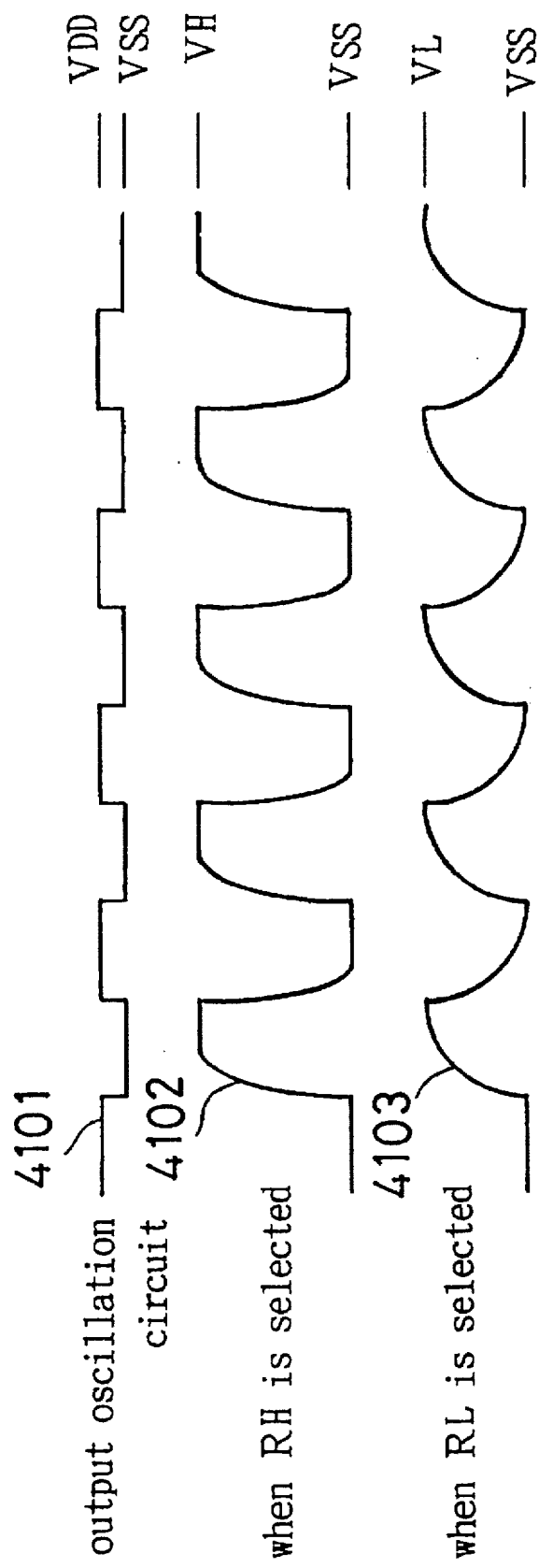
FIG. 41 is an explanatory diagram showing an output signal of an oscillation circuit and a voltage waveform applied to an EL element according to the seventeenth embodiment of the present invention.

FIG. 40 shows a chart diagram of a clock signal CLK (4001, 4003) inputted to the booster circuit 3912 and a waveform (4002, 4004) of a voltage applied to the EL element Ce. A charge is gradually charged in the Ce 3919 as the clock signals are applied. The amount of charging depends on the magnitude of the resistance of the CR oscillation. FIG. 41 shows a signal 4101 outputted from the oscillating circuit 3911 and a waveform (4102, 4103) of a voltage applied to the EL element Ce 3919. When the high resistor RH 3914 is selected by the switch 3917, the sufficient amount of charges for emitting a light from the EL element Ce 3919 is charged. On the other hand, when the low resistor RL 3913 is selected by the switch 3917, the charges are discharged before charges is sufficiently charged in the EL element 3914. That is, by frequency changing the clock signal according to the high or low resistance, the output voltage is capable of adjustment and the light emitting luminance can be controlled.

Figure 42:
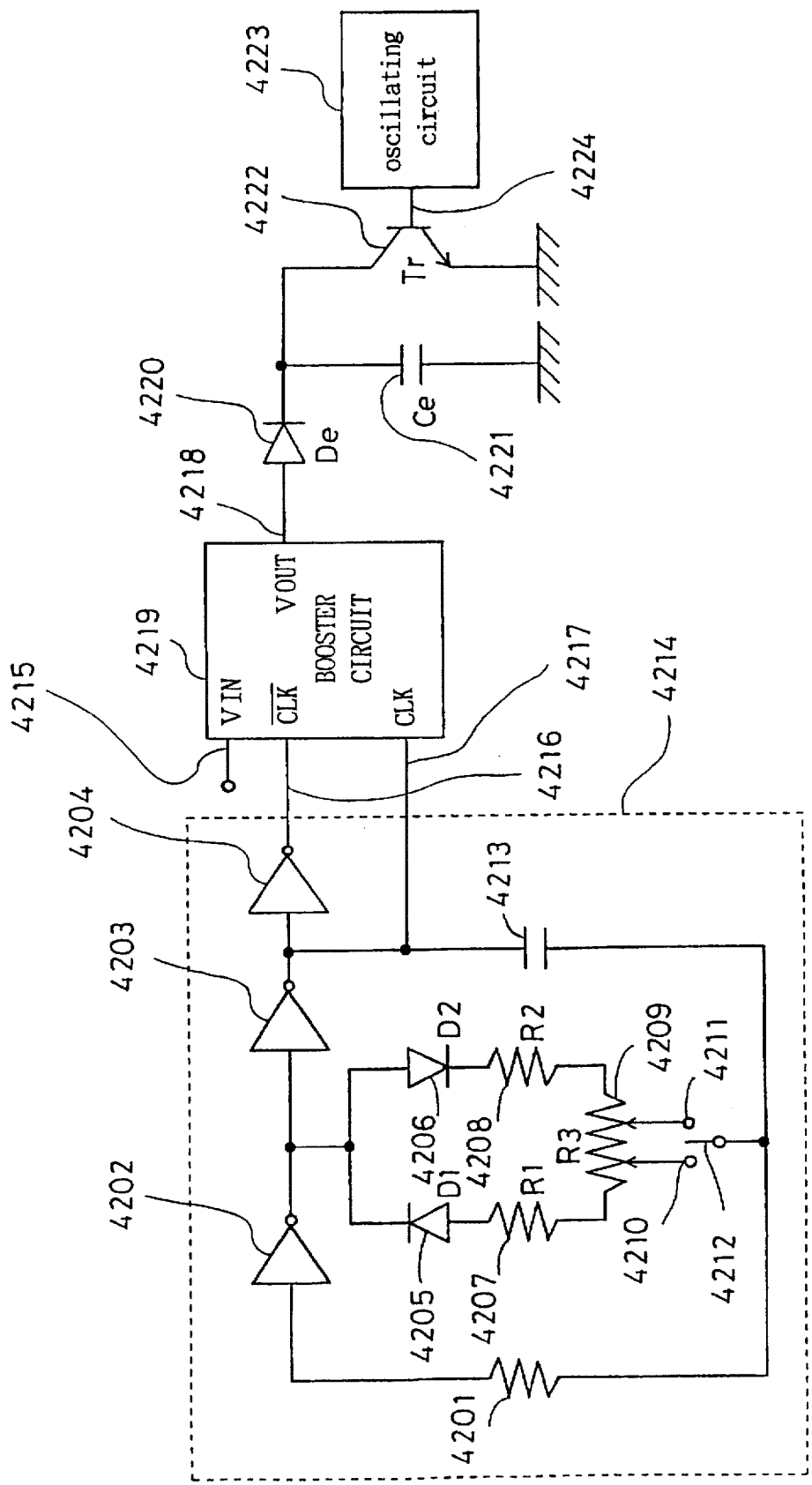
FIG. 42 is a schematic circuit diagram showing a step-up semiconductor integrated circuit device according to an eighteenth embodiment of the present invention.
Figure 43:
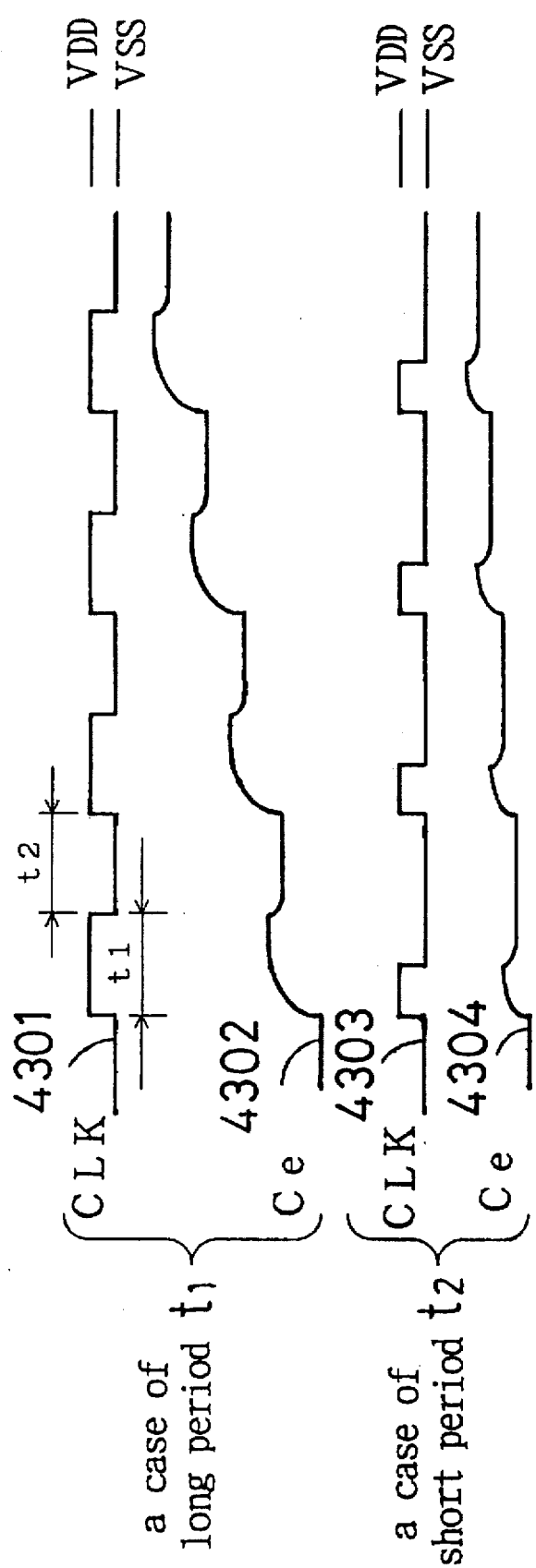
FIG. 43 is an explanatory diagram showing a clock output signal inputted to a booster circuit and a voltage waveform applied to an EL element according to the eighteenth embodiment of the present invention.

FIG. 42 shows a circuit diagram of an eighteenth embodiment according to the present invention. An oscillating circuit 4214 in this embodiment is also actuated by the CR oscillation as in the seventeenth embodiment, and the oscillating frequency is determined by a time constant of a circuit which is constituted by a C4213, an R14207, an R24208, an R34209, and the like. A booster circuit 4219 and an oscillating circuit 4223 are constituted in the same manner as that in the sixteenth embodiment. By connecting a switch S 4212 to any one of a terminal 4210 or a terminal 4211, the time constant of charge and discharge operation is switched. FIG. 43 shows clock signal waveforms 4301 and 4303 inputted to the booster circuit 4219 of FIG. 42 and waveforms 4302 and 4304 of voltages applied to the EL element Ce 4221. In the clock signal waveform 4201, t1 is representative of a state where only a diode D1 (4205) is rendered conductive, and the amount of resistance is a resistance (R3R) of the respective left halves of an R1 (4207) and an R3 (7209), and satisfies the following expression.

$$t1=1.1C\ (R2+R3L)$$

Similarly, t2 is representative of a state where only a diode D2 (4206) is rendered conductive, and the amount of resistance is a resistance (R3R) of the respective left halves of the R1 (4207) and the R3 (7209), and satisfies the following expression.

$$t2=1.1C\ (R2+R3R)$$

In this circuit, the ratio of dividing the resistor R3 (4209) into two parts can be changed by switching the switch 4212 to the terminal 4210 or the terminal 4211. If the switch S 4212 is connected to the terminal 4210, the value of (R1+R3L) is made small thereby to shorten t1. Inversely, if the switch 4212 is connected to the terminal 4211, the value of (R1+R3R) is increased thereby to make t1 long. In other words, the duty ratio of the oscillating frequency can be controlled by switching the switch 4212.

In FIG. 43, when t1 is made long (waveform 4301), a time required for charging the charges in the Ce 4221 is sufficient so that the amount of charging becomes increased (waveform 4403), however, when t1 is made short (waveform 4303), the time required for charging the charges in the Ce 4221 is shortened so that the amount of charging becomes reduced (waveform 4304).

Figure 44:
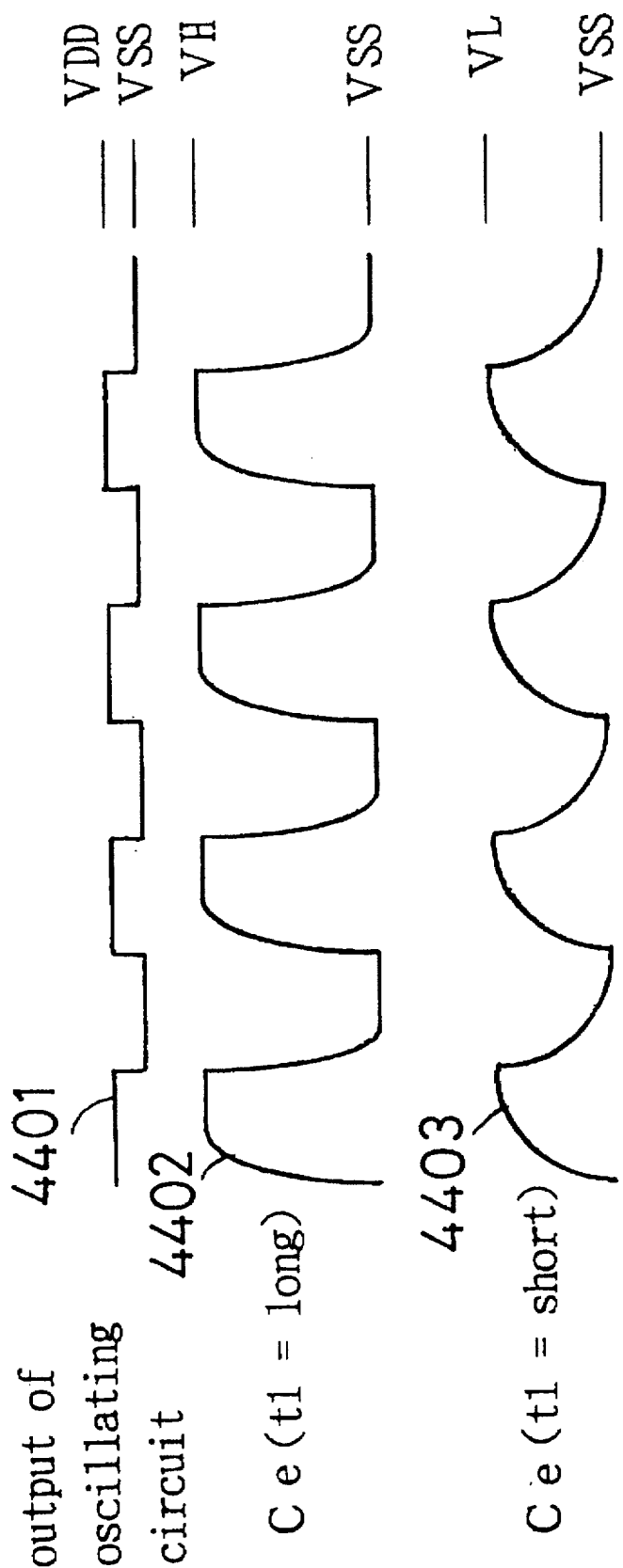
FIG. 44 is an explanatory diagram showing an output signal from an oscillation circuit and a voltage waveform applied to an EL element according to the eighteenth embodiment of the present invention.

FIG. 44 shows a signal 4401 outputted from the oscillating circuit 4223 and a waveform (4402, 4403) of a voltage applied to the EL element Ce 4221. In the case where t1 is selected to be longer by operating the switch S 4212, the amount of charges sufficient for light emitting of the EL element 4221 is charged, however, in the case where the EL element 4221 is selected to be shorter by operating the switch S 4212, the charges is caused to be discharged before the charges are charged in the EL element 4221. In other words, the output voltage can be adjusted depending on the large orsmall duty ratio of the clock signal waveform, and the light emitting luminance of the EL element 4221 can be controlled.

Figure 45:
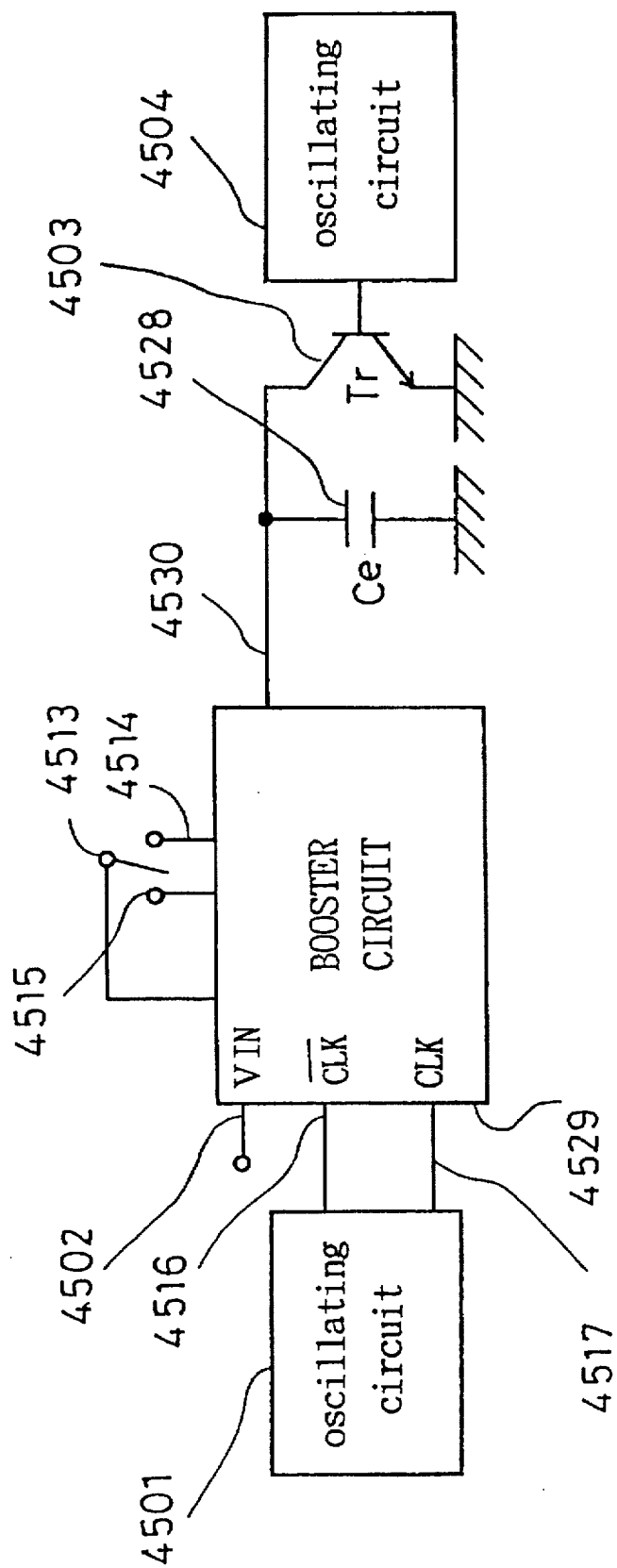
FIG. 45 is a schematic block diagram showing a step-up semiconductor integrated circuit device according to an nineteenth embodiment of the present invention.
Figure 46:
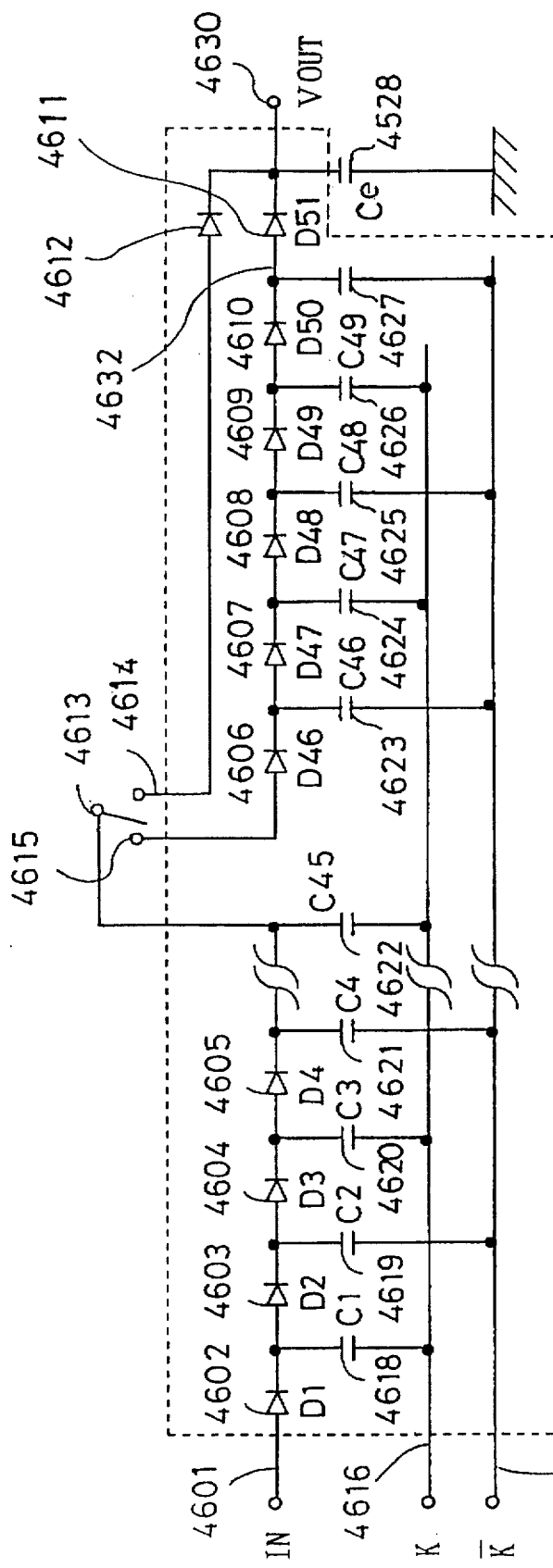
FIG. 46 is a schematic circuit diagram showing a step-up semiconductor circuit device according to the nineteenth embodiment of the present invention.

FIG. 45 shows a block diagram of an nineteenth embodiment according to the present invention. An oscillating circuit 4501 may be constituted by the CR oscillating circuit used in the seventeenth or eighteenth embodiment of the present invention, or by a crystal or a ceramic oscillating circuit. An oscillating circuit 4504 is constituted in the same manner as that in the seventeenth or eighteenth embodiment. The details of the booster circuit are as shown in FIG. 46. A booster circuit 4529 is constituted by boosting pairs of capacitors C1 to C50 (4618 to 4627) and diodes D1 to D50 (4602 to 4610), and a D51 (4611), a D52 (4612). Furthermore, the output of the boosting pairs has two kinds of the 45-th stage 4631 and the 50-th stage 4632, and the output can be selected by the switch S 4613.

In FIG. 46, provided that the voltage of a VIN 4601 and a clock signal (4616, 4617) is set to 3 V, respectively, and the forward threshold voltage VF of the diodes D1 to D52 (4602 to 4612) is set to 0.6 V, in the case where the switch S 4613 is connected to the terminal 4615, the booster circuit 4529 is constituted by the 50 boosting stages and the diode D51 (4611), and an output voltage Vout (50) is represented by the following expression.

$$Vout\ (50)=VDD+50\times VIN-(50+1)\times VF\ [V]$$

$$Vout\ (50)=122.4\ V$$

On the other hand, in the case where the switch S 4613 is connected to the terminal 4614, the booster circuit 4529 is constituted by the 45 boosting stages and the diode D52 (4612), and the output voltage Vout (45) is represented by the following expression.

$$Vout\ (45)=VDD+45\times VIN-(45+1)\times VF\ [V]$$

$$Vout\ (45)=110.4\ V$$

Thus, the output voltage can be changed by switching the number of boosting stages, and the light emitting luminance of the EL element Ce 4528 can be adjusted.

As was described above, the semiconductor integrated circuit and the electronic equipment device using the integrated circuit in accordance with the present invention have the advantages stated below.

That is, in the boosting circuit of the charge pump type or the switched capacitor type, pairs of the rectifier and the capacitor are completely dielectrically separated from each other, and therefore the boosting semiconductor integrated circuit with a high magnification ranging from several V to several hundreds V which could not be achieved by the conventional monolithic circuit.

Further, the area (chip size) of such a semiconductor integrated circuit device can be reduced with the result of the economical advantage. Further, the semiconductor integrated circuit device with such a boosting function has the function so as to output an electric signal upon receiving a light.

Furthermore, with the semiconductor integrated circuit thus organized, an electronic equipment incorporating a thin type EL light emitting element therein, which could not be realized until now, can be realized. Also, an electronic equipment with a charging function and a function that indicates a variety of messages and alarms by the ways (tint or luminance) of light emitting of the EL can be realized, The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appendedhereto, and their equivalents.

What is claimed is:

1. A boosting semiconductor integrated circuit comprising: a support substrate; an insulation film formed on the support substrate; a semiconductor film formed on the insulation film; and a plurality of boosting elements each including a charge storing element and a rectifying element; wherein the plurality of boosting elements are electrically connected in series with each other, a portion of the semiconductor film corresponding to each boosting element is electrically separated from a portion of the semiconductor film corresponding to the other boosting elements with a dielectric isolation layer which is formed on the insulation film, wherein the rectifying element has a first terminal comprised of the semiconductor film and a second terminal disposed on the first terminal, and wherein the charge storing element comprises the second terminal, a dielectric layer disposed on the second terminal and a conductive layer disposed on the dielectric layer.

2. A boosting semiconductor integrated circuit according to claim 1; wherein the first terminal corresponds to an anode and the second terminal corresponds to a cathode.

3. A semiconductor integrated circuit according to claim 1; wherein the rectifying element comprises a source region and a drain region formed in the semiconductor layer, a gate insulating film formed on the semiconductor layer, and a gate electrode formed on the gate insulating film, and wherein the gate electrode is electrically connected to one of the source region and the drain region and constitutes the anode terminal and the other one of the source region and the drain region constitutes the cathode terminal.

4. A semiconductor integrated circuit according to claim 1; further comprising an input terminal for supplying an input voltage to the plurality of boosting elements; an output terminal for providing an output voltage from the plurality of boosting elements; wherein each of the rectifying elements has an anode terminal and a cathode terminal, the charge storing element is electrically connected to the cathode terminal, and the plurality of boosting elements are electrically connected in series in an anode to cathode fashion.

5. A semiconductor integrated circuit according to claim 4; wherein the rectifying element comprises a metal-semiconductor junction device having an insulating layer formed on the support substrate, a semiconductor layer formed on the insulating layer, and a metal layer formed on the semiconductor layer.

6. A semiconductor integrated circuit according to claim 4; wherein the charge storing element comprises an insulating film formed on the support substrate, a first polycrystalline thin film formed on the insulating film, a second polycrystalline thin film formed over the first polycrystalline thin film and a dielectric layer interposed between the first and second polycrystalline thin films.

7. A semiconductor integrated circuit according to claim 4; the charge storing element comprises an insulating film formed on the support substrate, a first conductive layer formed on the insulating film, a dielectric layer formed on the first conductive layer and a second conductive layer formed on the dielectric layer, wherein the thickness of the dielectric layer of the charge boosting element connected to the input terminal is thinner than that of the dielectric layer of the charge boosting element connected to the output terminal to enable the input voltage to be boosted efficiently.

8. A semiconductor integrated circuit according to claim 1; wherein the rectifying element comprises a metal-semiconductor junction element.

9. A semiconductor integrated circuit according to claim 8; wherein the charge storing element comprises a cathode region formed in the semiconductor layer and electrically connected to the cathode of the rectifying element, a conductive layer formed over the cathode region, and a dielectric layer interposed between the cathode region and the conductive layer.

10. A semiconductor integrated circuit according to claim 8; further comprising drive means connected to the output terminal for controlling the output voltage to efficiently supply power to a load.

11. A semiconductor integrated circuit according to claim 10; further comprising timer means electrically connected to the drive means for supplying a timing signal to control the driving means.

12. A semiconductor integrated circuit according to claim 11; wherein the driving means comprises first and second driving elements connected to the output terminal, and wherein the timer means includes means for supplying a first timing signal to the first driving element and a second timing signal different in phase from the first timing signal to the second driving element.

13. A semiconductor integrated circuit according to claim 1; further comprising an input terminal for supplying an input voltage to the plurality of boosting elements; and an output terminal for providing an output voltage from the plurality of boosting elements; wherein each of the rectifying elements has an anode terminal and a cathode terminal, and the charge storing elements are electrically connected to the cathode terminal, each of the boosting elements being electrically connected in series in an anode to cathode fashion, wherein the plurality of boosting elements are arranged to form first and second charge boosting circuits, and the output voltage of the first boosting circuit is different in phase from that of the second boosting circuit such that the first and the second boosting circuits efficiently supply a boosted voltage to a load.

14. A semiconductor circuit according to claim 1; further comprising a clock pulse generating circuit, an input terminal for supplying an input voltage to the plurality of boosting elements, and an output terminal for providing an output voltage from the plurality of boosting elements, wherein each of the rectifying elements has an anode terminal and a cathode terminal, and the charge storing elements are elec-

23 trically connected to the cathode terminal, each of the boosting elements being electrically connected in series in an anode to cathode fashion, wherein the plurality of boosting elements are arranged to form first and second charge boosting circuits, the first boosting circuit supplies a boosted output voltage to the check pulse generating circuit and the second boosting circuit, and the clock pulse generating circuit supplies a boosted clock pulse to the second boosting circuit to enable the second boosting circuit unit to output a large output voltage.

15. A semiconductor integrated circuit according to claim 4; further comprising a clock signal generating circuit for supplying a first clock signal and a second clock signal, the second clock signal having a reverse polarity from that of the first clock signal; wherein the first clock signal is supplied to a charge storing element connected to the anode of the rectifying elements and the second clock signal is supplied to a charge storing element connected to the cathode of the rectifying elements such that the clock signal generating circuit controls the level of the output voltage.

16. A semiconductor integrated circuit according to claim 15; wherein the voltage is controlled by a frequency of the first and the second clock signals supplied by the clock signal generating circuit.

17. A semiconductor integrated circuit according to claim 16; wherein the clock signal generating circuit comprises a plurality of inverter circuits connected in series, a high resistance element and a low resistance element connected to an intermediate point between the inverter circuits, and a switch element electrically connected between an input of the plurality of the inverter circuits and one of the resistance elements.

18. A semiconductor integrated circuit according to claim 4; wherein each of the boosting elements comprises a first and a second MOS transistor and a charge storing element, one of a source and a drain of the first MOS transistor being connected to one of a source and a drain of the second MOS transistor, the other one of the source and the drain of the first MOS transistor being connected to one of the terminals of the charge storing element and constituting a node A, the other one of the source and the drain of the second MOS transistor being connected to the other one of the terminals of the charge storing element and constituting a node B, and each of the boosting elements being electrically connected in series with the node A and one of the source and the drain of the first MOS transistor; means for supplying a first clock signal to a gate of the first MOS transistor; means for supplying a second clock signal to a gate of the second MOS transistor, wherein the second clock signal has a reverse polarity to that the first clock signal; wherein node A of each boosting element is electrically connected to a first common line, and node B of each boosting element is electrically connected to a second common line, the first common line being electrically separated from a ground potential through a diode and the second common line being electrically separated from ground potential through a diode to effectively operate the second MOS transistor.

19. A semiconductor integrated circuit according to claim 18; further comprising a third MOS transistor, and wherein one of a source and a drain of the third MOS transistor is connected to the node B, the other one of the source and the drain of the third MOS transistor is connected to a ground terminal, and a gate of the third MOS transistor is provided with the first clock signal.

20. A semiconductor integrated circuit according to claim 18; wherein mode A of each boosting element is electrically connected in series to a first alternate boosting element

24 through a diode, and node B of each boosting element is electrically connected in series to a second alternate boosting element.

21. A semiconductor integrated circuit according to claim 20; wherein the plurality of boosting elements comprises a first group of boosting elements and a second group of boosting elements, each boosting element being connected in series with the first group and the second group alternately, the first clock signal being provided to both the gates of the first and the third MOS transistors of the first group and the second clock signal being provided to the gate of the second MOS transistor of the first group, the second clock signal being provided to both the gates of the first and the third MOS transistors of the second group and the first clock signal being provided to the gate of the second MOS transistor of the second group, the nodes A of the first group being electrically connected through a diode with each other, the nodes A of the second group being electrically connected through a diode with each other, the nodes B of the first group being electrically connected with each other, and the nodes B of the second group being electrically connected with each other.

22. A semiconductor integrated circuit according to claim 18; further comprising a polycrystalline semiconductor layer formed over the insulating layer, the polycrystalline semiconductor layer having a first conductivity type, and wherein source and drain regions each having second conductivity type are formed in the polycrystalline semiconductor layer, and a gate insulating film and gate electrode are formed on the polycrystalline semiconductor to form the first and the second MOS transistors of the boosting elements.

23. A semiconductor integrated circuit according to claim 18; wherein the charge storing element comprises an insulating film formed on the substrate, a first conductive film formed on the insulating film, a second conductive film formed on the first conductive film, and a dielectric layer interposed between the first and second conductive films.

24. A semiconductor integrated circuit according to claim 23; wherein the dielectric layer comprises a stacked layer formed of a silicon oxide film and a tantalum oxide film.

25. A semiconductor integrated circuit according to claim 23; wherein a thickness of the dielectric layer of the boosting element electrically connected to the input terminal is thinner than that of the dielectric layer of the boosting unit electrically connected to the output terminal.

26. A semiconductor integrated circuit comprising: a substrate; and a plurality of charge boosting elements formed on the substrate, each of the charge boosting elements being electrically connected in series; wherein each of the charge boosting elements comprises a rectifying element and a charge storing element electrically connected to the rectifying element, the plurality of charge boosting elements are electrically connected in series, and each rectifying element comprises a metal-semiconductor junction device.

27. A semiconductor integrated circuit according to claim 26; wherein the metal-semiconductor junction device comprises an insulating layer formed on the substrate, a semiconductor layer formed on the insulating layer, and a metal layer formed on the semiconductor layer.

28. A semiconductor integrated circuit comprising: a substrate, an insulating layer formed on the substrate; a semiconductor layer formed on the insulating layer; a plurality of charge boosting elements formed on the semiconductor layer; an input terminal for supplying an input voltage to the plurality of boosting elements; and an output terminal for providing an output voltage from the plurality of boosting elements; wherein each of the boosting elements comprises a rectifying element having an anode terminal and a cathode terminal, and a charge storing element electrically connected to the cathode terminal, each of the boosting elements is electrically connected in series in an anode-to-cathode fashion, and wherein each of the boosting elements is dielectrically isolated from the other boosting elements.

29. A semiconductor integrated circuit according to claim 28; wherein the charge storing element comprises a cathode region formed in the semiconductor layer and electrically connected to the cathode of the rectifying element, a conductive layer formed over the cathode region, and a dielectric layer interposed between the cathode region and the conductive layer.

30. A semiconductor integrated circuit according to claim 28; further comprising clock generating means for supplying a first clock signal and a second clock signal, the second clock signal having a reverse polarity to that of the first clock signal, wherein the first clock signal is supplied to a charge storing element connected to the anode of a rectifying element and the second clock signal is supplied to a cathode of the rectifying element.

31. A semiconductor integrated circuit according to claim 28; further comprising drive means connected to the output terminal for controlling the output voltage to efficiently supply power to a load.

32. A semiconductor integrated circuit according to claim 31; further comprising timer means electrically connected to the drive means for supplying a timing signal to control the driving means.

33. A semiconductor integrated circuit according to claim 32; wherein the driving means comprises first and second driving elements connected to the output terminal, and wherein the timer means includes means for supplying a first timing signal to the first driving element and a second timing signal different in phase from the first timing signal to the second driving element.

34. A semiconductor integrated circuit according to claim 31; wherein the drive means comprises a CMOS inverter circuit.

35. A semiconductor integrated circuit according to claim 28; wherein the rectifying element comprises a source region and a drain region formed in the semiconductor layer, a gate insulating film formed on the semiconductor layer, and a gate electrode formed on the gate insulating film, and wherein the gate electrode is electrically connected to one of the source region and the drain region and constitutes the anode terminal and the other one of the source region and the drain region constitutes the cathode terminal.

36. A semiconductor integrated circuit comprising: a substrate, an insulating layer formed on the substrate; a semiconductor layer formed on the insulating layer; and a plurality of charge boosting elements formed on the semiconductor layer; wherein each of the boosting elements comprises a rectifying element and a charge storing element electrically connected to the rectifying element, each of the boosting elements is electrically connected in series, each of the boosting elements is dielectrically isolated from the other boosting elements, and each rectifying element comprises a metal-semiconductor junction element.

37. A semiconductor integrated circuit comprising: a substrate; a plurality of charge boosting elements formed on the substrate, each of the charge boosting elements being electrically connected in series with each other; wherein each of the charge boosting elements comprises a rectifying element and a charge storing element electrically connected to the rectifying element, each of the charge boosting elements being electrically connected in series, the plurality of charge boosting elements are arranged to form first and second charge boosting circuits, and wherein the output voltage of the first charge boosting circuit is different in phase from that of the second charge boosting circuit such that the first and the second charge boosting circuits efficiently supply a boosted voltage to a load.

38. A semiconductor circuit comprising: a clock pulse generating circuit; a substrate; and a plurality of charge boosting elements formed on the substrate; wherein each of the charge boosting elements comprises a rectifying element and a charge storing element electrically connected to the rectifying element, each of the charge boosting elements being electrically connected in series, and wherein the plurality of charge boosting elements are arranged to form first and second charge boosting circuits, the first boosting circuit supplies a boosted output voltage to the clock pulse generating circuit and the second boosting circuit, and the clock pulse generating circuit supplies a boosted clock pulse to the second boosting circuit to enable the second boosting circuit unit to output a large output voltage.

39. A semiconductor integrated circuit comprising: a substrate; and a plurality of charge boosting elements formed on the substrate; wherein each of the charge boosting elements comprises a rectifying element and a charge storing element electrically connected to the rectifying element, each of the charge boosting elements being electrically connected in series; a clock signal generating circuit for supplying a first clock signal and a second clock signal, the second clock signal having a reverse polarity from that of the first clock signal; wherein the first clock signal is supplied to a charge storing element connected to an anode of the rectifying elements and the second clock signal is supplied to a charge storing element connected to a cathode of the rectifying elements such that the clock signal generating circuit controls the level of an output voltage from the plurality of boosting elements.

40. A semiconductor integrated circuit according to claim 39; wherein the output voltage is controlled by a frequency of the first and the second clock signals supplied by the clock signal generating circuit.

41. A semiconductor integrated circuit according to claim 40; wherein the clock signal generating circuit comprises a plurality of inverter circuits connected in series, a high resistance element and a low resistance element connected to an intermediate point between the inverter circuits, and a switch element electrically connected between an input of the plurality of the inverter circuits and one of the resistance elements.

42. A semiconductor integrated circuit comprising: a substrate; and a plurality of boosting elements formed on the substrate, each of the boosting elements being electrically connected in series; wherein each of the boosting elements comprises a first and a second MOS transistor and a charge storing element having terminals, one of a source and a drain of the first MOS transistor being connected to one of a source and a drain of the second MOS transistor, the other one of the source and the drain of the first MOS transistor being connected to one of the terminals of the charge storing element and constituting a node A, the other one of the source and the drain of the second MOS transistor being connected to the other one of the terminals of the charge storing element and constituting a node B, and each of the boosting elements being electrically connected in series with the node A and one of the source and the drain of the first MOS transistor; means for supplying a first clock signal to a gate of the first MOS transistor; means for supplying a second clock signal to a gate of the second MOS transistor, wherein the second clock signal has a reverse polarity to that the first clock signal; wherein node A of each boosting element is electrically connected to a first common line, and node B of each boosting element is electrically connected to a second common line, the first common line being electrically separated from a ground potential through a diode and the second common line being electrically separated from ground potential through a diode to effectively operate the second MOS transistor.

43. A semiconductor integrated circuit according to claim 42; further comprising a third MOS transistor, and wherein one of a source and a drain of the third MOS transistor is connected to the node B, the other one of the source and the drain of the third MOS transistor is connected to a ground terminal, and a gate of the third MOS transistor is provided with the first clock signal.

44. A semiconductor integrated circuit according to claim 42; wherein node A of each boosting element is electrically connected in series to a first alternate boosting element through a diode, and node B of each boosting element is electrically connected in series to a second alternate boosting element.

45. A semiconductor integrated circuit according to claim 44; wherein the plurality of boosting elements comprises a first group of boosting elements and a second group of boosting elements, each boosting element being connected in series with the first group and the second group alternately, the first clock signal being provided to both the gates of the first and the third MOS transistors of the first group and the second clock signal being provided to the gate of the second MOS transistor of the first group, the second clock signal being provided to both the gates of the first and the third MOS transistors of the second group and the first clock signal being provided to the gate of the second MOS transistor of the second group, nodes A of the first group being electrically connected through a diode with each other, nodes A of the second group being electrically connected through a diode with each other, nodes B of the first group being electrically connected with each other, and nodes B of the second group being electrically connected with each other.

46. A semiconductor integrated circuit according to claim 42; wherein the substrate comprises a support substrate, an insulating layer formed over the support substrate and a semiconductor layer formed over the insulating layer, the respective boosting elements being formed in the semiconductor layer, and wherein each boosting element is dielectrically isolated from the other boosting elements with a dielectric isolation layer formed on the insulating layer and below the semiconductor layer.

47. A semiconductor integrated circuit according to claim 42; wherein the substrate comprises a support substrate, an insulating layer formed over the support substrate and a polycrystalline semiconductor layer formed over the insulating layer, the polycrystalline semiconductor layer having a first conductivity type, and wherein source and drain regions each having second conductivity type are formed in the polycrystalline semiconductor layer, and a gate insulating film and gate electrode are formed on the polycrystalline semiconductor to form the first and the second MOS transistors of the boosting elements.

48. A semiconductor integrated circuit according to claim 42; wherein the charge storing element comprises an insulating film formed on the substrate, a first conductive film formed on the insulating film, a second conductive film formed on the first conductive film, and a dielectric layer interposed between the first and second conductive films.

49. A semiconductor integrated circuit according to claim 48; wherein the dielectric layer comprises a stacked layer formed of a silicon oxide film and a tantalum oxide film.

50. A semiconductor integrated circuit according to claim 48; wherein a thickness of the dielectric layer of the boosting element electrically connected to the input terminal is thinner than that of the dielectric layer of the boosting unit electrically connected to the output terminal.

* * * * *